(12) United States Patent
Kim et al.

(10) Patent No.: US 12,089,325 B2
(45) Date of Patent: Sep. 10, 2024

(54) PRINTED CIRCUIT BOARD

(71) Applicant: LG INNOTEK CO., LTD., Seoul (KR)

(72) Inventors: Jae Hwa Kim, Seoul (KR); Seung Yul Shin, Seoul (KR); Sung Wuk Ryu, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 243 days.

(21) Appl. No.: 17/596,257

(22) PCT Filed: Jun. 4, 2020

(86) PCT No.: PCT/KR2020/007241
§ 371 (c)(1),
(2) Date: Dec. 6, 2021

(87) PCT Pub. No.: WO2020/246812
PCT Pub. Date: Dec. 10, 2020

(65) Prior Publication Data
US 2022/0304147 A1      Sep. 22, 2022

(30) Foreign Application Priority Data

Jun. 4, 2019   (KR) .................. 10-2019-0065796
Aug. 26, 2019  (KR) .................. 10-2019-0104524

(51) Int. Cl.
*H05K 1/02*        (2006.01)
*H05K 1/11*        (2006.01)

(52) U.S. Cl.
CPC .......... *H05K 1/0296* (2013.01); *H05K 1/115* (2013.01); *H05K 2201/09036* (2013.01); *H05K 2201/09509* (2013.01); *H05K 2201/09854* (2013.01)

(58) Field of Classification Search
None
See application file for complete search history.

(56) References Cited

U.S. PATENT DOCUMENTS 6,611,046 B2 *   8/2003   Yang ................... H05K 3/002
                                                        257/774
7,858,437 B2    12/2010   Jung et al.
(Continued)

FOREIGN PATENT DOCUMENTS

CN      105376926 A      3/2016
CN      106888552 A      6/2017
(Continued)

OTHER PUBLICATIONS

KR 20060132684 A (Translation) (Year: 2023).*
(Continued)

*Primary Examiner* — Hoa C Nguyen
*Assistant Examiner* — John B Freal
(74) *Attorney, Agent, or Firm* — Saliwanchik, Lloyd & Eisenschenk

(57) ABSTRACT

A printed circuit board according to an embodiment includes a first insulating layer; a second insulating layer disposed on the first insulating layer; and a cavity formed in the first and second insulating layers; wherein the cavity includes a first portion formed in the second insulating layer; and a second portion formed in the first insulating layer; wherein the first portion has a first cross-sectional shape, and wherein the second part has a second cross-sectional shape different from the first cross-sectional shape.

16 Claims, 19 Drawing Sheets

(56) References Cited

U.S. PATENT DOCUMENTS

| | | |
|---|---|---|
| 8,101,868 B2 | 1/2012 | Ito et al. |
| 8,692,132 B2 | 4/2014 | Ito et al. |
| 8,785,788 B2 | 7/2014 | Shimizu et al. |
| 8,872,041 B2 | 10/2014 | Lee et al. |
| 8,912,451 B2 | 12/2014 | Ito et al. |
| 8,973,259 B2 | 3/2015 | Ito et al. |
| 9,027,238 B2 | 5/2015 | Ito et al. |
| 9,282,626 B2 | 3/2016 | Yoo et al. |
| 10,015,885 B2 | 7/2018 | Jung et al. |
| 10,076,038 B2 | 9/2018 | Park et al. |
| 10,580,846 B2 | 3/2020 | Seo et al. |
| 10,674,608 B2 | 6/2020 | Park et al. |
| 10,916,619 B2 | 2/2021 | Seo et al. |
| 11,096,286 B2 | 8/2021 | Park et al. |
| 11,812,556 B2 | 11/2023 | Park et al. |
| 11,812,644 B2 | 11/2023 | Seo et al. |
| 2007/0095471 A1 | 5/2007 | Ito et al. |
| 2011/0314668 A1 | 12/2011 | Ito et al. |
| 2012/0006587 A1 | 1/2012 | Ito et al. |
| 2012/0077317 A1 | 3/2012 | Ito et al. |
| 2012/0106108 A1 | 5/2012 | Ito et al. |
| 2012/0145666 A1 | 6/2012 | Maeda |
| 2012/0186861 A1 | 7/2012 | Shimizu et al. |
| 2015/0014034 A1* | 1/2015 | Hwang ............... H05K 3/4697 29/841 |
| 2015/0053457 A1 | 2/2015 | Kim et al. |
| 2015/0342046 A1 | 11/2015 | Kim et al. |
| 2016/0044788 A1 | 2/2016 | Park et al. |
| 2018/0247994 A1 | 8/2018 | Seo et al. |
| 2018/0324952 A1 | 11/2018 | Park et al. |
| 2020/0176547 A1 | 6/2020 | Seo et al. |
| 2020/0214135 A1 | 7/2020 | Park et al. |
| 2021/0159305 A1 | 5/2021 | Seo et al. |
| 2021/0345491 A1 | 11/2021 | Park et al. |

FOREIGN PATENT DOCUMENTS

| | | | |
|---|---|---|---|
| CN | 108511487 A | | 9/2018 |
| JP | 2012-164952 A | | 8/2012 |
| JP | 2013-222946 A | | 10/2013 |
| JP | 2015-43408 A | | 3/2015 |
| JP | 2015-109392 A | | 6/2015 |
| JP | 2019-87722 A | | 6/2019 |
| KR | 10-0659510 B1 | | 12/2006 |
| KR | 20060132684 A | * | 12/2006 |
| KR | 10-2007-0111886 A | | 11/2007 |
| KR | 10-2010-0051322 A | | 5/2010 |
| KR | 10-2012-0012270 A | | 2/2012 |
| KR | 10-2014-0083314 A | | 7/2014 |
| KR | 10-2015-0024093 A | | 3/2015 |
| KR | 10-1613525 B1 | | 4/2016 |
| KR | 10-2017-0086921 A | | 7/2017 |
| WO | 2007/043714 A1 | | 4/2007 |

OTHER PUBLICATIONS

International Search Report dated Sepetmber 24, 2021 in International Application No. PCT/KR2020/007241.
Office Action dated Nov. 15, 2023 in Chinese Application No. 202080041855.2.
Office Action dated Jul. 2, 2024 in Japanese Application No. 2021-571625.
Office Action dated Feb. 23, 2024 in Korean Application No. 10-2019-0104524.

* cited by examiner

PRINTED CIRCUIT BOARD

CROSS-REFERENCE TO RELATED APPLICATIONS

This application is the U.S. national stage application of International Patent Application No. PCT/KR2020/007241, filed Jun. 4, 2020, which claims the benefit under 35 U.S.C. § 119 of Korean Application Nos. 10-2019-0065796, filed Jun. 4, 2019; and 10-2019-0104524, filed Aug. 26, 2019, the disclosures of each of which are incorporated herein by reference in their entirety.

TECHNICAL FIELD

An embodiment relates to a printed circuit board, and more particularly, to a printed circuit board including a cavity for mounting a device.

BACKGROUND ART

An embedded printed circuit board (Printed Circuit Board) is different from a conventional printed circuit board in which a passive device and an active device share the surface of the printed circuit board, and has devices such as resistors and capacitors embedded in the board, so that free space can be secured on the surface of the printed circuit board, compared to the conventional printed circuit board, the wiring density can be increased, so that more compact electronic devices can be developed.

In addition, such an embedded printed circuit board has the effect of reducing problems such as impedance generation and signal delay due to parasitic effects in electronic devices using high-frequency signals because the devices are connected in the vertical direction and the wiring length is greatly reduced.

The core technology of such an embedded printed circuit board is a technology of embedding a device in the board and a technology of precisely connecting the embedded device and a wiring circuit.

In general, an embedded printed circuit board proceeds with a cavity formation process of removing a device mounting area after forming an insulating layer. And, according to the related art, an embedded printed circuit board is manufactured by mounting a device in the formed cavity, and stacking an additional insulating layer on upper and lower portions of the insulating layer on which the device is mounted, respectively.

However, various problems occur in the cavity forming process as described above, which has a problem affecting product reliability.

Accordingly, recently, a system in package (SIP) having a complex function by mounting an IC or a passive device on the outermost layer of a printed circuit board has been developed.

However, in the conventional SIP, several ICs or passive devices in a package are integrated into one module to realize package miniaturization, as it is composed of a plurality of layers, there are problems in that it takes a long time to manufacture a package substrate and a limitation in thickness, and an increase in production cost.

DISCLOSURE

Technical Problem

The embodiment provides a printed circuit board having a new structure and a method for manufacturing the same.

The embodiment provides a printed circuit board capable of reducing the thickness by providing a space in which a device can be mounted in the outermost insulating layer and a method of manufacturing the same.

In addition, the embodiment provides a printed circuit board capable of easily forming a cavity for device mounting by forming an outermost insulating layer of photoimageable dielectrics (PID) and solving a reliability problem that may occur when forming a cavity, and a method for manufacturing the same.

In addition, the embodiment provides a printed circuit board capable of improving the adhesion between the outermost insulating layer and the inner insulating layer by disposing an additional insulating layer of a different material between the outermost insulating layer and the inner insulating layer made of different materials, and a method for manufacturing the same.

In addition, the embodiment provides a printed circuit board capable of solving the problem of peeling between the inner insulating layer and the outermost insulating layer that occurs after the cavity is formed by disposing a pad on the cavity boundary region on the inner insulating layer, and a package substrate including the same.

The technical problems to be achieved in the proposed embodiment are not limited to the technical problems mentioned above, and other technical problems not mentioned in the embodiments will be clearly understood by those of ordinary skill in the art to which the embodiments proposed from the description below.

Technical Solution

A printed circuit board according to an embodiment includes a first insulating layer; a second insulating layer disposed on the first insulating layer; and a cavity formed in the first and second insulating layers; wherein the cavity includes a first portion formed in the second insulating layer; and a second portion formed in the first insulating layer; wherein the first portion has a first cross-sectional shape, and wherein the second portion has a second cross-sectional shape different from the first cross-sectional shape.

In addition, the second insulating layer includes a photosensitive insulating resin.

In addition, the first insulating layer includes a non-photosensitive insulating resin.

In addition, the first portion has a first depth; and the second portion has a second depth greater than the first depth.

In addition, the printed circuit board further comprises a first circuit pattern buried in an upper portion of the first insulating layer, wherein the first depth corresponds to a thickness of the second insulating layer, and wherein the second depth corresponds to a thickness of the first circuit pattern.

In addition, the first cross-sectional shape includes a trapezoidal shape, and the second cross-sectional shape includes a square shape.

In addition, the printed circuit board further comprises a first via passing through the first insulating layer; and a second via passing through the second insulating layer; wherein the first cross-sectional shape corresponds to a cross-sectional shape of the first via, and wherein the second cross-sectional shape corresponds to the cross-sectional shape of the first circuit pattern.

On the other hand, the printed circuit board according to the embodiment includes a first insulating layer; a second insulating layer disposed on the first insulating layer; and a first circuit pattern buried under the first insulating layer and having a lower surface disposed on the same plane as a lower surface of the first insulating layer, wherein the cavity has a first depth from the lower surface of the first insulating layer. and the first depth corresponds to a thickness of the first circuit pattern, and a cross-sectional shape of the cavity corresponds to a cross-sectional shape of the first circuit pattern.

On the other hand, the printed circuit board according to the embodiment includes a first insulating layer; a first circuit pattern disposed on an upper surface of the first insulating layer; and a second insulating layer disposed on the upper surface of the first insulating layer to cover the first circuit pattern and having a cavity formed in an upper portion, wherein the second insulating layer includes a first insulating part disposed on the upper surface of the first insulating layer; and a second insulating part disposed on an upper surface of the first insulating part and having the cavity, wherein the second insulating part includes a photosensitive insulating resin, and the cavity is disposed to pass through the second insulating part.

In addition, the printed circuit board further includes a via disposed to pass through the second insulating layer, wherein the via includes a first via part passing through the first insulating part and a second via part passing through the second insulating part and in direct contact with the first via part.

In addition, a cross-sectional shape of the cavity corresponds to a cross-sectional shape of the second via part.

In addition, at least a part of the first circuit pattern overlaps the cavity in a vertical direction.

Meanwhile, a method of manufacturing a printed circuit board according to an embodiment includes preparing a first insulating layer, forming a first circuit pattern buried in an upper portion of the first insulating layer, forming a second insulating layer covering the first circuit pattern on an upper surface of the first insulating layer, forming a first portion of a cavity passing through the second insulating layer, and forming a second portion of the cavity removing a cavity pattern exposed through the first portion among the first circuit pattern buried in the upper portion of the first insulating layer, wherein the first portion has a first cross-sectional shape, and the second portion has a second cross-sectional shape different from the first cross-sectional shape.

In addition, the second insulating layer includes a photosensitive insulating resin, and the first insulating layer includes a non-photosensitive insulating resin.

In addition, the first portion has a first depth corresponding to a thickness of the second insulating layer, the second portion is greater than the first depth, and has a second depth corresponding to the first circuit pattern.

In addition, the first cross-sectional shape includes a trapezoidal shape, and the second cross-sectional shape includes a quadrangular shape.

In addition, the method further includes forming a via hole passing through the second insulating layer together with the cavity when the cavity is formed, wherein the first cross-sectional shape corresponds to a cross-sectional shape of the via hole, and the second cross-sectional shape corresponds to the cross-sectional shape of the first circuit pattern.

A printed circuit board according to an embodiment includes a first insulating portion; a second insulating portion disposed on an upper surface of the first insulating portion and including a first opening; and a third insulating portion disposed under a lower surface of the first insulating portion and including a second opening, wherein the second insulating portion is an insulating layer disposed at an uppermost portion among a plurality of insulating layers, and the third insulating portion is an insulating layer disposed at a lowermost portion among the plurality of insulating layers, and the second and third insulating portions include a photosensitive insulating resin.

In addition, the first insulating portion includes a prepreg.

In addition, the printed circuit board further includes a first circuit pattern portion disposed on the upper surface and the lower surface of the first insulating portion and including a lead part exposed through the first and second openings; and a first via portion disposed in the first insulating portion, wherein the first opening exposes a lead part disposed on the upper surface of the first insulating portion, and the second opening exposes a lead part disposed under the lower surface of the first insulating portion.

In addition, the printed circuit board further includes, a second circuit pattern portion disposed on an upper surface of the second insulating portion; a second via portion disposed in the second insulating portion; a third circuit pattern portion disposed under a lower surface of the third insulating portion; and a third via portion disposed in the third insulating portion, wherein at least one of the second and third via portions has a width smaller than a width of the first via portion.

In addition, at least one of the second and third circuit pattern portions has a line width smaller than a line width of the first circuit pattern portion.

In addition, at least one of the second and third via portions has a width in a range of 5 μm to 50 μm.

In addition, at least one of the first and second openings has a width in the range of 500 to 8000 μm.

In addition, the printed circuit board further includes a first adhesive insulating layer disposed between the first insulating portion and the second insulating portion; and a second adhesive insulating layer disposed between the first insulating portion and the third insulating portion, wherein the first and second adhesive insulating layers include an insulating material different from that of the second and third insulating portions.

In addition, at least one of the first and second adhesive insulating layers includes a thermosetting resin.

In addition, the first via portion is disposed to pass through at least one of the first and second adhesive insulating layers, the second circuit pattern portion is disposed on the upper surface of the first adhesive insulating layer, and the third circuit pattern is disposed under the lower surface of the second adhesive insulating layer.

In addition, a first circuit pattern portion disposed on the upper surface of the first insulating portion includes a first pad disposed around a region opened through the first opening, and a first circuit pattern portion disposed under the lower surface of the first insulating portion includes a second pad disposed around a region opened through the second opening.

In addition, each of the first and second pads includes a first portion covered by any one of the second and third insulating portions; and a second portion exposed by any one of the first and second openings.

In addition, the first pad is disposed to surround the lead part disposed on the upper surface of the first insulating portion, and the second pad is disposed to surround the lead part disposed under the lower surface of the first insulating portion.

On the other hand, a package substrate according to the embodiment includes a first insulating portion; a second insulating portion disposed on an upper surface of the first insulating portion and including a first opening; a third insulating portion disposed under a lower surface of the first insulating portion and including a second opening; a first circuit pattern portion disposed on upper and lower surfaces of the first insulating portion and including a lead part exposed through the first and second openings; a first via portion passing through at least one insulating layer constituting the first insulating portion; a second circuit pattern portion disposed on an upper surface of the second insulating portion; a second via portion passing through the second insulating portion; a third circuit pattern portion disposed under a lower surface of the third insulating portion; a third via portion passing through the third insulating portion; a first connection portion disposed on a lead part disposed on the upper surface of the first insulating portion; a second connection portion disposed under a lead part disposed under a lower surface of the first insulating portion; a first device disposed on the first connection portion and exposed through the first opening; and a second device disposed under the second connection portion and exposed through the second opening, wherein the second insulating portion is an insulating layer disposed at an uppermost portion among a plurality of insulating layers, and the third insulating portion is an insulating layer disposed at a lowermost portion among the plurality of insulating layers, wherein the first insulating portion includes a prepreg, and wherein the second and third insulating portions include a photosensitive insulating resin.

In addition, the package substrate further includes a first adhesive insulating layer disposed between the first insulating portion and the second insulating portion and including an insulating material different from that of the second and third insulating portions; and a second adhesive insulating layer disposed between the first insulating portion and the third insulating portion and including an insulating material different from that of the second and third insulating portions, wherein the first and second adhesive insulating layers includes a thermosetting resin.

In addition, a first circuit pattern portion disposed on the upper surface of the first insulating portion includes a first pad disposed around an region opened through the first opening, and a first circuit pattern portion disposed under the lower surface of the first insulating portion includes a second pad disposed around an region opened through the second opening, and each of the first and second pads includes a first portion covered by any one of the second and third insulating portions and a second portion exposed by any one of the first and second openings.

Advantageous Effects

According to an embodiment, an outermost insulating layer of the printed circuit board is formed of a photoimageable dielectric (PID). Then, a cavity in which the device can be mounted is formed in the outermost insulating layer, and the device can be mounted in the formed cavity.

Accordingly, as at least a part of the device is disposed in the outermost insulating layer of the printed circuit board, it is possible to reduce the overall thickness of the package substrate by the depth of the cavity. In addition, according to an embodiment, as the insulating layer in which the cavity is formed is composed of photoimageable dielectics (PID), and it is possible to easily form a cavity for device mounting through exposure and development, accordingly, it is possible to solve a reliability problem that may occur when the cavity is formed.

Further, according to an embodiment, a cavity pattern is formed together with a circuit pattern when the circuit pattern to be embedded in the insulating layer is formed. Then, a cavity is formed in the insulating layer by removing the formed cavity pattern. Accordingly, it is possible to solve the problem that the glass fiber included in the insulating layer is exposed through the cavity depending on the material forming the insulating layer, thereby improving the reliability of the cavity.

Further, according to an embodiment, a depth of the entire cavity can be easily adjusted through a combination of a first portion of the cavity formed on the photosensitive insulating resin and a second portion of the cavity formed in a non-photosensitive insulating resin.

In addition, according to the embodiment, it is possible to remove a process such as a laser process or sand blasting, which must be essentially included in forming the cavity, thereby simplifying the manufacturing process and remarkably reducing the manufacturing cost.

In addition, according to an embodiment of the present invention, an additional insulating layer of a different material is disposed between the outermost insulating layer and the inner insulating layer. In this case, the additional insulating layer may be composed of a thermosetting insulating resin. Here, when the prepreg (PPG) constituting the inner insulating layer and the photosensitive insulating resin (PID) constituting the outermost insulating layer are in direct contact with each other, adhesion to each other may be lowered due to a difference in physical properties between the prepreg and the photosensitive insulating resin. Accordingly, in the embodiment, by additionally disposing a thermosetting insulating resin between the photosensitive insulating resin and the prepreg, the adhesion between the photosensitive insulating resin and the prepreg may be increased, and thus product reliability may be improved.

Further, according to an embodiment of the present invention, a pad is disposed on the cavity boundary region on the inner insulating layer. The pad may be disposed to surround a region where the cavity is to be formed. At this time, when the pad is not present, an undercut occurs in the lower region of the photosensitive insulating resin on the cavity boundary region, accordingly, a peeling problem between the inner insulating layer and the outermost insulating layer may occur. Accordingly, in the embodiment, by disposing the pad on the cavity boundary region, the undercut problem, which is weak in reliability, can be solved, and thus product reliability can be improved.

DETAILED DESCRIPTION OF THE EMBODIMENTS

Hereinafter, preferred embodiments of the present invention will be described in detail with reference to the accompanying drawings.

However, the technical spirit of the present invention is not limited to some embodiments described, but may be implemented in various different forms, and, as long as it is within the scope of the technical spirit of the present invention, one or more of the components may be selectively combined and substituted between the embodiments.

In addition, terms (including technical and scientific terms) used in the embodiments of the present invention may be interpreted as meanings that can be generally understood by those of ordinary skill in the art to which the present invention pertains unless explicitly defined and described, and the meanings of commonly used terms such as predefined terms may be interpreted in consideration of the contextual meaning of the related art. In addition, the terms used in the embodiments of the present invention are for describing the embodiments and are not intended to limit the present invention.

In this specification, the singular may also include the plural unless specifically stated in the phrase, and when it is described as "A and (and) at least one (or more than one) of B and C", it may include one or more of all combinations that can be combined with A, B, and C. In addition, in describing the components of the embodiment of the present invention, terms such as first, second, A, B, (a), (b), etc. may be used.

These terms are only used to distinguish the component from other components, and are not limited to the essence, order, or order of the component by the term. And, when it is described that a component is 'connected', 'coupled' or 'contacted' to another component, the component is not only directly connected, coupled or contacted to the other component, but also with the component it may also include a case of 'connected', 'coupled' or 'contacted' due to another element between the other elements.

In addition, when it is described as being formed or disposed on "above (on) or below (under)" of each component, the above (on) or below (under) is one as well as when two components are in direct contact with each other. Also includes a case in which another component as described above is formed or disposed between two components. In addition, when expressed as "above (up) or below (under)", it may include not only the upward direction but also the meaning of the downward direction based on one component.

Figure 1:
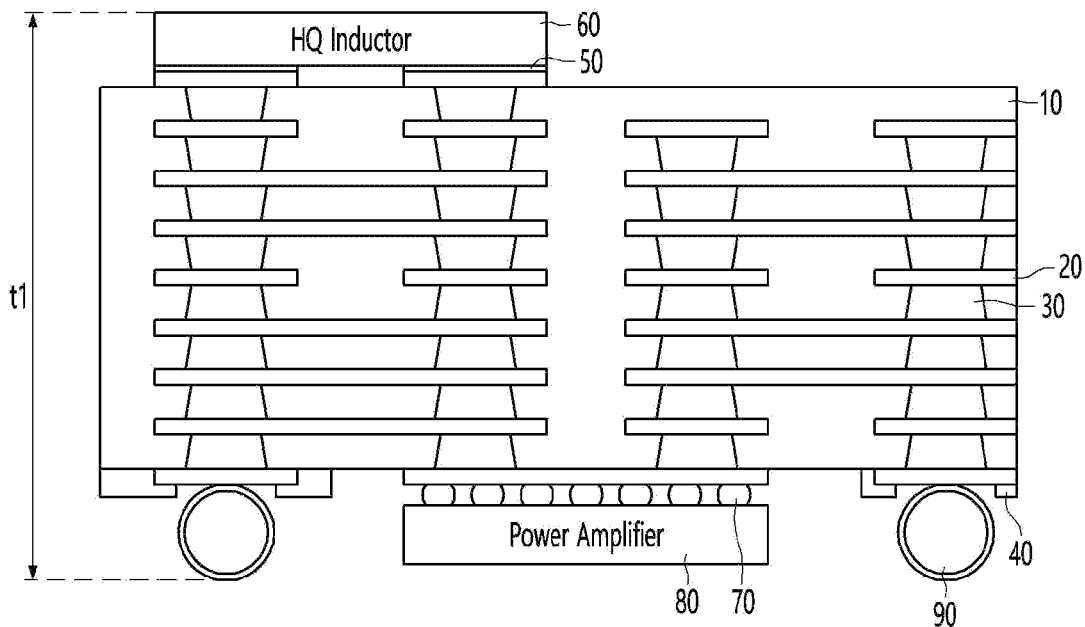
FIG. 1 is a view showing a package substrate according to a comparative example.

FIG. 1 is a view showing a package substrate according to a comparative example.

Hereinafter, a printed circuit board and a package substrate including the same according to a comparative example will be described with reference to FIG. 1.

At least one device is mounted on the package substrate 1. The device mounted on the package substrate 1 includes at least one of a passive device and an active device.

The package substrate 1 includes an insulating layer 1 having a multilayer structure, a circuit pattern 20 disposed on a surface of the insulating layer 1, a via 30 disposed through the insulating layer 1 and electrically connecting circuit patterns of different layers to each other; and a protective layer 40 disposed on an outermost insulating layer among the insulating layers 1.

In this case, the circuit pattern 20 includes a pad disposed in a region on which the devices 60 and 80 are mounted among surfaces of the outermost insulating layer.

Then, the devices 60 and 80 are mounted on the pad.

In this case, connection portions 50 and 70 may be disposed on the pad, and the devices 60 and 80 are fixed on the pad by the connection portions 50 and 70.

Here, the devices 60 and 80 include an inductor or a power supply device.

On the other hand, the package substrate 1 in the comparative example as described above has a structure in which the devices 60 and 80 are mounted on a pad disposed on an outermost side of the printed circuit board. Accordingly, since the devices 60 and 80 are mounted on the outermost pad of the package substrate 1 in the comparative example, the overall thickness of the package substrate is increased.

That is, the thickness of the package substrate 1 in the comparative example is determined by a sum of the thickness of the printed circuit board, the thickness of the connection portions 50 and 70 and the thickness of the devices 60 and 80. In other words, the thickness of the package substrate 1 in the comparative example is affected by the thickness of the devices 60 and 80 in addition to the thickness of the printed circuit board. Accordingly, the overall thickness of the package substrate in the comparative example is increased.

In addition, in the package substrate 1 in the comparative example, it was possible to form a cavity on the printed circuit board, and to mount the device on the formed cavity. However, the printed circuit board in the comparative example uses a laser drill to form the cavity, which has a problem in that the reliability of the printed circuit board is lowered in the cavity formation process.

In addition, among the devices 60 and 80, there are devices that are mounted in a way that they are embedded in the substrate, but there are also devices that must be mounted on the outermost side of the substrate due to various reliability problems. In this case, as in the comparative example, the device mounted on the outermost surface had a structure in which it was simply mounted on a pad disposed on the outermost surface of the printed circuit board. Due to this, the overall thickness of the package substrate in the comparative example increased.

That is, in the package substrate 1 in the comparative example, a cavity was formed using a $CO_2$ laser drill, and then the device was mounted in the cavity. However, it is difficult to accurately align the package substrate 1 in the comparative example when the cavity is formed.

In addition, in the package substrate 1 according to the comparative example, a glass fiber of the PPG remains unprocessed in the cavity forming process, which causes damage to the device when the device is mounted. That is, in the package substrate 1 according to the comparative example, the cavity is formed by using a laser drill, so that after the cavity forming process, non-uniformity of the cavity area due to wall roughness occurs, accordingly, there is a problem in that damage occurs during device mounting.

In addition, the package substrate 1 according to the comparative example has a problem in that the process cost increases due to a number of laser drills used for manufacturing the cavity.

In addition, in the package substrate 1 according to the comparative example, a laser stopper for a laser drilling process must be disposed, and there is a problem in that it is difficult to completely remove the stopper after the cavity formation is completed. That is, the package substrate 1 according to the comparative example has a plating deviation of copper plating, so it is difficult to uniformly etch the stopper, accordingly, there is a problem in that the circuit pattern connected to the device is etched together when the stopper is etched.

In addition, the package substrate 1 according to the comparative example must necessarily include a process using a laser or sand blast when the cavity is formed, and accordingly, the manufacturing process becomes complicated and manufacturing cost increases.

In order to solve this problem, the embodiment provides a printed circuit board having a new structure capable of mounting a plurality of devices on one printed circuit board and a method of manufacturing the same.

Figure 2:
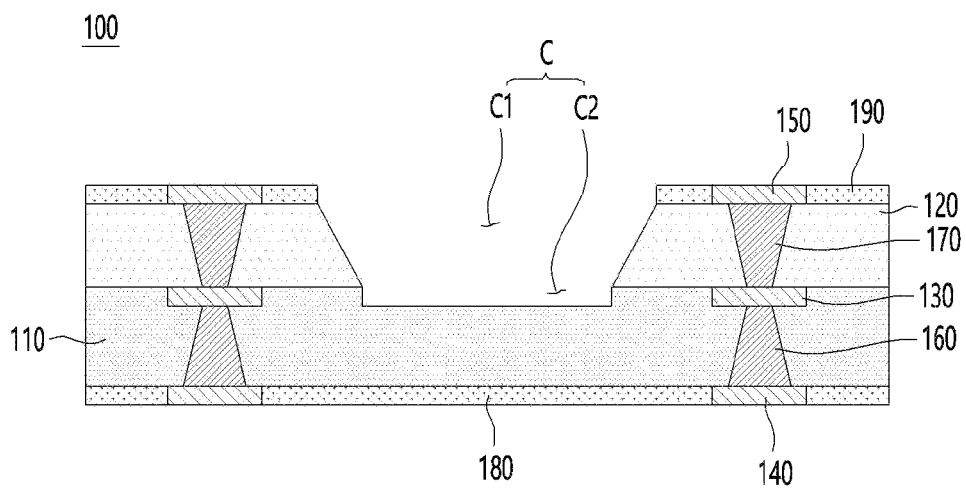
FIG. 2 is a view showing a printed circuit board according to A first embodiment.

FIG. 2 is a view showing a printed circuit board according to a first embodiment.

Referring to FIG. 2, the printed circuit board 100 may include a plurality of insulating layers 110 and 120.

At this time, although the printed circuit board 100 in the embodiment is illustrated as having a two-layer structure based on the insulating layer, the embodiment is not limited thereto.

That is, the first insulating layer 110 of the printed circuit board 100 may have a plurality of layer structures. For example, the first insulating layer 110 may have a layer structure of two or more layers. In addition, a via may be disposed in each of the first insulating layers 110 having a layer structure of two or more layers, and a circuit pattern may be disposed on a surface of each of the first insulating layers 110.

The printed circuit board 100 represents electrical wiring connecting circuit components based on a circuit design as a wiring diagram, and thus electrical conductors can be reproduced on the plurality of insulating layers 110 and 120. In addition, the printed circuit board 100 may mount devices such as electrical components, form wirings for connecting them in a circuit, and mechanically fix components other than the electrical connection function of the components.

The plurality of insulating layers 110 and 120 have a mutually stacked structure.

Preferably, the plurality of insulating layers 110 and 120 may include a first insulating layer 110 and a second insulating layer 120.

The printed circuit board 100 in the embodiment may have a three-layer structure based on the circuit pattern layer, but is not limited thereto. For example, in the printed circuit board 100 in the embodiment, the number of insulating layers may increase, and accordingly, the number of circuit pattern layers may also increase.

The first insulating layer 110 and the second insulating layer 120 may be formed of different insulating resins.

For example, the first insulating layer 110 may be made of a non-photosensitive insulating resin.

Specifically, the first insulating layer 110 may include glass or plastic. In detail, the first insulating layer 110 may include chemically strengthened/semi-tempered glass such as soda lime glass or aluminosilicate glass, or containing reinforced or flexible plastics such as polyimide (PI), polyethylene terephthalate (PET), propylene glycol (PPG), polycarbonate (PC), or sapphire.

The first insulating layer 110 may include a material such as Liquid Crystal Polymer (LCP), PPG (FR1,2,3,4), Teflon, Ajinomoto build up film (ABF), Resin Coated Copper (RCC), and the like. However, the embodiment is not limited thereto. As an example, the first insulating layer 110 may include any one of a prepreg (PPG), Ajinomoto build-up film (ABF), a copper foil coating resin (RCC, Resin Coated Copper), a liquid crystal polymer (LCP, Liquid Crystal Polymer), and Teflon.

In addition, the first insulating layer 110 may include glass therein to ensure rigidity.

The second insulating layer 120 may be disposed on the first insulating layer 110. Unlike the first insulating layer 110, the second insulating layer 120 may be made of a photosensitive insulating resin.

For example, the second insulating layer 120 may be formed by laminating a photosensitive resin film or applying a photosensitive resin paste or liquid. At this time, in one example, the photosensitive resin material may include any one or more selected from photosensitive polyhydroxystyrene (PHS), photosensitive polybenzoxazole (PBO), photosensitive polyimide (PI), photosensitive benzocyclobutene (BCB), photosensitive polysiloxane, photosensitive epoxy, and novolac resin.

Also, the second insulating layer 120 may be made of a photosensitive insulating resin including an epoxy resin, a photoinitiator, a silicon filler, and a hardener.

On the other hand, the printed circuit board 100 in the embodiment includes a cavity (C). In this case, the cavity C may include a first portion C1 formed in the second insulating layer 120 and a second portion C2 formed in the first insulating layer 110.

The cavity C in the embodiment may be formed by a combination of the second portion C2 formed in the first insulating layer 110 and the first portion C1 formed in the second insulating layer 120.

In other words, the first portion C1 formed in the second insulating layer 120 and the second portion C2 formed in the first insulating layer 110 may be connected to each other to form one cavity C.

In this case, the first portion C1 formed inn the second insulating layer 120 may be formed by performing processes such as exposure and development. That is, in the comparative example, when the cavity was formed on the insulating layer, a laser drilling process or a sand blasting process was performed. Accordingly, in the comparative example, damage to the surface of the circuit pattern or the insulating layer may occur during the laser drilling or sand blasting process, and the manufacturing cost increases as the manufacturing process becomes complicated.

In contrast, the second insulating layer 120 in the embodiment is made of a photosensitive insulating resin. Accordingly, the first portion C1 that is a part of the cavity C for mounting an electronic component (not shown) may be formed on the second insulating layer 120 by an exposure and development process. In this case, the first portion C1 may be formed to pass through upper and lower surfaces of the second insulating layer 120. That is, the first portion C1 may be a through hole passing the second insulating layer 120.

As described above, in the embodiment, the second insulating layer 120 is made of a photosensitive insulating resin, and exposure and development are performed in the photosensitive insulating resin to form a cavity for device mounting. Accordingly, various reliability problems occurring in the process of forming the cavity can be solved, and the device can be mounted in the cavity, thereby reducing the overall thickness of the package substrate by the depth of the cavity.

Meanwhile, the first portion C1 may have a first cross-sectional shape. For example, the first portion C1 may have a shape in which an inner wall has a predetermined inclination. For example, the first portion C1 may have a trapezoidal shape.

A second portion C2 of the cavity C recessed inward may be formed at the surface of the first insulating layer 110.

The second portion C2 of the cavity C may be connected to the first portion C1.

The second portion C2 may be a recess disposed on the upper surface of the first insulating layer 110.

The second portion C2 may have a second cross-sectional shape. For example, an inner wall of the second portion C2 may be perpendicular to a main surface. For example, the second portion C2 may have a rectangular shape.

Meanwhile, the first portion C1 of the cavity C may have a first depth. In addition, the second portion C2 of the cavity C may have a second depth.

The first portion C1 may be formed to pass the second insulating layer 120. Accordingly, the first depth of the first portion C1 may correspond to the thickness of the second insulating layer 120.

The second portion C2 may be a recess disposed on the first insulating layer 110 to have a second depth. In this case, the second depth of the second portion C2 may correspond to the thickness of the first circuit pattern 130 buried in an upper portion of the first insulating layer 110. Preferably, the second portion C2 may be formed by removing a cavity pattern (described later) formed together with the first circuit pattern 130 when the first circuit pattern 130 is formed. Accordingly, the depth of the second portion C2 may correspond to the thickness of the first circuit pattern 130.

For example, the first depth of the first portion C1 of the cavity C may be the same as the thickness of the second insulating layer 120. For example, the second depth of the second portion C2 of the cavity C may be the same as the thickness of the first circuit pattern 130.

In the embodiment, when forming the first circuit pattern 130 to be buried in the upper portion of the first insulating layer 110 as described above, a cavity pattern is formed together with the first circuit pattern 130. Then, the cavity pattern is removed to form the second portion C2 of the cavity in the first insulating layer 110. At this time, when the cavity is formed by removing the surface of the first insulating layer 110 through laser or sand blasting, glass present in the first insulating layer 110 may be exposed to an outside, and the exposed glass may affect the reliability of the cavity (C).

Alternatively, in the embodiment, the cavity C is formed by removing the cavity pattern disposed in the first insulating layer 110, rather than removing the first insulating layer 110. Therefore, in the embodiment, it is possible to solve the problem that the glass fiber included in the insulating layer is exposed through the cavity, and thus the reliability of the cavity can be improved.

Further, according to an embodiment, the depth of the entire cavity can be easily adjusted through a combination of the first portion of the cavity formed on the photosensitive insulating resin and the second portion of the cavity formed on the non-photosensitive insulating resin.

In addition, according to the embodiment, it is possible to remove a process such as a laser process or sand blasting, which must be essentially included in forming the cavity, thereby simplifying the manufacturing process and remarkably reducing the manufacturing cost.

Meanwhile, a circuit pattern layer is disposed on surfaces of the first insulating layer 110 and the second insulating layer 120.

The circuit pattern layer may include a first circuit pattern 130 buried in an upper portion of the first insulating layer 110, a second circuit pattern 140 disposed under a lower surface of the first insulating layer 110, and a third circuit pattern 150 disposed on an upper surface of the second insulating layer 120.

The first circuit pattern 130 may be buried in an upper portion of the first insulating layer 110. In other words, an upper surface of the first circuit pattern 130 may be positioned on the same plane as the upper surface of the first insulating layer 110.

Accordingly, the lower surface of the second insulating layer 120 may include a region in contact with the upper surface of the first insulating layer 110 and a region in contact with the upper surface of the first circuit pattern 130.

The second circuit pattern 140 may have a structure protruding below the lower surface of the first insulating layer 110. In addition, the third circuit pattern 150 may have a structure that protrudes above the upper surface of the second insulating layer 120.

As described above, the first to third circuit patterns 130, 140, and 150 disposed on the surface of each insulating layer may be formed of a metal material having high electrical conductivity. To this end, the first to third circuit patterns 130, 140, and 150 may be formed of at least one metal material selected from gold (Au), silver (Ag), platinum (Pt), titanium (Ti), tin (Sn), copper (Cu), and zinc (Zn). In addition, the first to third circuit patterns 130, 140, and 150 may be formed of a paste or solder paste including at least one metal material selected from gold (Au), silver (Ag), platinum (Pt), titanium (Ti), tin (Sn), copper (Cu), and zinc (Zn) having excellent bonding strength. Preferably, the first to third circuit patterns 130, 140, and 150 may be formed of copper (Cu), which has high electrical conductivity and is relatively inexpensive.

The first to third circuit patterns 130, 140, and 150 may be formed by an additive process, a subtractive process, a modified semi additive process (MSAP) and a semi additive process (SAP) method, which is a typical printed circuit board manufacturing process, and a detailed description thereof will be omitted herein.

Meanwhile, vias 160 and 170 for electrically connecting circuit patterns disposed on different layers to each other may be disposed in each insulating layer. The vias 160 and 170 may be disposed to pass through each insulating layer, and accordingly, circuit patterns disposed on surfaces of different insulating layers may be electrically connected to each other.

To this end, the vias 160 and 170 may include a first via 160 and a second via 170.

The first via 160 may be disposed to pass through the first insulating layer 111. The first via 170 may electrically connect the first circuit pattern 130 disposed on the upper portion of the first insulating layer 110 and the second circuit pattern 140 disposed under the lower surface of the first insulating layer 110.

The second via 170 may be disposed to pass through the second insulating layer 120. The second via 170 may electrically connect the third circuit pattern 150 disposed on the upper surface of the second insulating layer 120 and the first circuit pattern 130.

As described above, the first insulating layer 110 may be formed of a non-photosensitive insulating resin. For example, the first insulating layer 110 may be formed of a prepreg containing glass therein.

Accordingly, the first via 160 may have a first width.

The first via 160 is a passage for the interlayer electrical connection of the printed circuit board, may be formed by drilling an electrically disconnected layer to form a via hole, and filling the formed via hole with a conductive material or plating with a conductive material.

A metal material for forming the first via 160 may be any one material selected from Cu, Ag, Sn, Au, Ni, and Pd, and the metal material may be filled using any one of electroless plating, electrolytic plating, screen printing, sputtering, evaporation, ink jetting and dispensing or combination thereof.

In this case, the via hole may be formed by any one of machining methods, including mechanical, laser, and chemical processing.

When the via hole is formed by mechanical processing, methods such as milling, drilling, and routing may be used, and when the via hole is formed by laser processing, a UV or $CO_2$ laser method may be used, and when the via hole is formed by chemical processing, drugs containing aminosilane, ketones, etc. may be used, and the like, thereby the first insulating layer 110 may be opened.

On the other hand, the processing by the laser is a cutting method that takes the desired shape to melt and evaporate a part of the material by concentrating optical energy on the surface, it can easily process complex formations by computer programs, and can process composite materials that are difficult to cut by other methods.

As the laser processing drill, it is preferable to use a YAG (Yttrium Aluminum Garnet) laser, a $CO_2$ laser, or an ultraviolet (UV) laser. The YAG laser is a laser that can process both the copper foil layer and the insulating layer, and the $CO_2$ laser is a laser that can process only the insulating layer.

At this time, as described above, the first via 160 is formed by filling the inside of the via hole formed by laser processing with a metal material, accordingly, there is a limit to the minimum width that can be formed through the laser processing. Accordingly, the first via 160 may have a width of 50 μm to 200 μm. For example, the first via 160 may have a width in a range of 70 μm to 100 μm.

Meanwhile, the second via 170 is disposed in the second insulating layer 120 made of a photosensitive insulating resin. Accordingly, the second via 170 may be formed by opening the photosensitive insulating resin constituting the second insulating layer 120 through exposure and development to form a via hole, and filling the formed via hole with a metal material. Accordingly, the second via 170 may have a second width smaller than the first width. For example, the second via 170 may have a width satisfying a range of 15 μm to 50 μm. For example, the second via 170 may have a width satisfying a range of 20 μm to 35 μm.

Meanwhile, a first protective layer 180 may be disposed under a lower surface of the first insulating layer 110, and a second protective layer 190 may be disposed on an upper surface of the second insulating layer 120. The first protective layer 180 may be disposed under the lower surface of the first insulating layer 110 to protect the lower surface of the first insulating layer 110. Also, the first protective layer 180 may be disposed to cover at least a part of the lower surface of the second circuit pattern 140 disposed under the lower surface of the first insulating layer 110.

In addition, the second protective layer 190 may be disposed on the upper surface of the second insulating layer 120, but is not limited thereto. That is, the second protective layer 190 is also made of the same photosensitive insulating resin as the second insulating layer 120. Accordingly, the second protective layer 190 may be selectively omitted. However, in order to protect the surface of the third circuit pattern 150 disposed on the upper surface of the second insulating layer 120, the second protective layer 190 may be selectively disposed on the second insulating layer 120.

The first protective layer 180 and the second protective layer 190 may include an insulating material.

The first protective layer 180 and the second protective layer 190 may include various materials that can be cured by heating after being applied to protect the surface of the circuit pattern. The first protective layer 180 and the second protective layer 190 may be a resist layer. For example, the first protective layer 180 and the second protective layer 190 may be a solder resist layer including an organic polymer material. For example, the first protective layer 180 and the second protective layer 190 may include an epoxy acrylate-based resin. In detail, the first protective layer 180 and the second protective layer 190 may include a resin, a curing agent, a photoinitiator, a pigment, a solvent, a filler, an additive, an acryl-based monomer, and the like. However, the embodiment is not limited thereto, and the first protective layer 180 and the second protective layer 190 may be any one of a photo-solder resist layer, a coverlay, and a polymer material.

A thickness of the first protective layer 180 and the second protective layer 190 may be 1 μm to 20 μm. The thickness of the first protective layer 180 and the second protective layer 190 may be 1 μm to 15 μm. For example, the thickness of the first protective layer 180 and the second protective layer 190 may be 5 μm to 20 μm. When the thickness of the first protective layer 180 and the second protective layer 190 is greater than 20 μm, the thickness of the printed circuit board may increase. When the thickness of the first protective layer 180 and the second protective layer 190 is less than 1 μm, the reliability of the circuit pattern may be deteriorated.

According to an embodiment, an outermost insulating layer of the printed circuit board is formed of a photoimageable dielectric (PID). Then, a cavity in which the device can be mounted is formed in the outermost insulating layer, and the device can be mounted in the formed cavity.

Accordingly, as at least a part of the device is disposed in the outermost insulating layer of the printed circuit board, it is possible to reduce the overall thickness of the package substrate by the depth of the cavity. In addition, according to an embodiment, as the insulating layer in which the cavity is formed is composed of photoimageable dielectrics (PID), and it is possible to easily form a cavity for device mounting through exposure and development, accordingly, it is possible to solve a reliability problem that may occur when the cavity is formed.

Further, according to an embodiment, a cavity pattern is formed together with a circuit pattern when the circuit pattern to be embedded in the insulating layer is formed. Then, a cavity is formed in the insulating layer by removing the formed cavity pattern. Accordingly, it is possible to solve the problem that the glass fiber included in the insulating layer is exposed through the cavity depending on the material forming the insulating layer, thereby improving the reliability of the cavity.

Further, according to an embodiment, a depth of the entire cavity can be easily adjusted through a combination of a first portion of the cavity formed on the photosensitive insulating resin and a second portion of the cavity formed in a non-photosensitive insulating resin.

In addition, according to the embodiment, it is possible to remove a process such as a laser process or sand blasting, which must be essentially included in forming the cavity, thereby simplifying the manufacturing process and remarkably reducing the manufacturing cost.

Hereinafter, a method of manufacturing the printed circuit board according to the first embodiment shown in FIG. 2 will be described in detail.

FIGS. 3 to 9 are cross-sectional views showing a method of manufacturing the printed circuit board according to the first embodiment shown in FIG. 2 in order of process.

First, the method of manufacturing a printed circuit board may be performed as a process of simultaneously manufacturing a plurality of printed circuit boards on both sides of the carrier board CB with a member such as the carrier board CB interposed therebetween.

Figure 3:
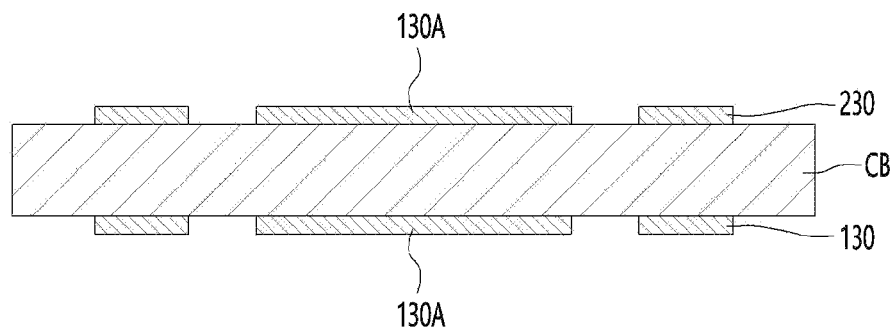
FIGS. 3 to 9 are cross-sectional views showing a method of manufacturing the printed circuit board according to the first embodiment shown in FIG. 2 in order of process.

Referring to FIG. 3, in the method of manufacturing a printed circuit board, a process of preparing a carrier board CB and forming a first circuit pattern 130 on an upper surface and a lower surface of the carrier board CB may be performed, respectively. In this case, a cavity pattern 130A may be formed on upper and lower surfaces of the carrier board CB together with the first circuit pattern 130. In this case, the cavity pattern 130A may be formed together with the first circuit pattern 130. Preferably, the cavity pattern 130A may be formed of the same metal material as the first circuit pattern 130.

Figure 4:
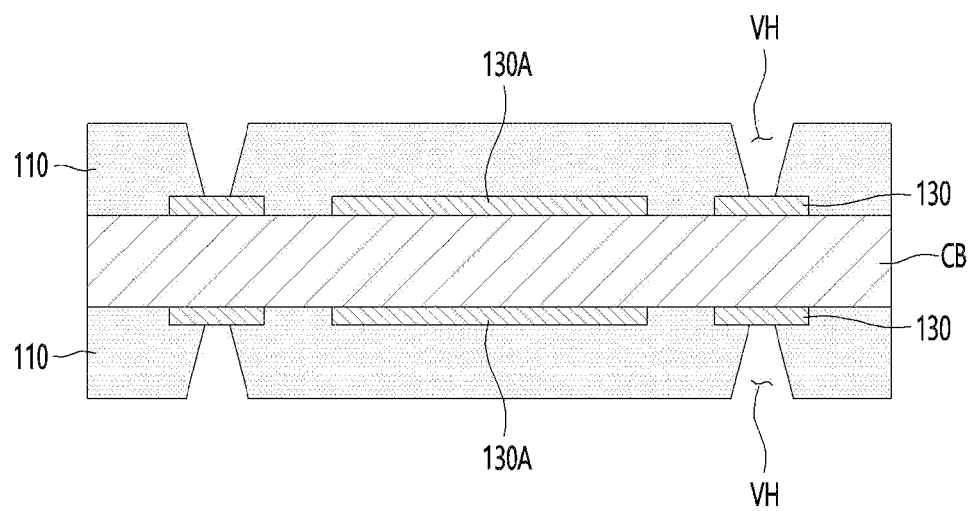

Next, referring to FIG. 4, when the cavity pattern 130A and the first circuit pattern 130 are formed, the first insulating layer 110 may be formed on the upper and lower surfaces of the carrier board CB, respectively. In this case, the first insulating layer 110 may be formed of a non-photosensitive material as described above. For example, the first insulating layer 110 may be formed of a prepreg.

In addition, when the first insulating layer 110 is formed, the first insulating layer 110 may be processed to form a via hole VH. In this case, the first insulating layer 110 is formed of a prepreg, and accordingly, the via hole VH may be formed by a laser process.

Figure 5:
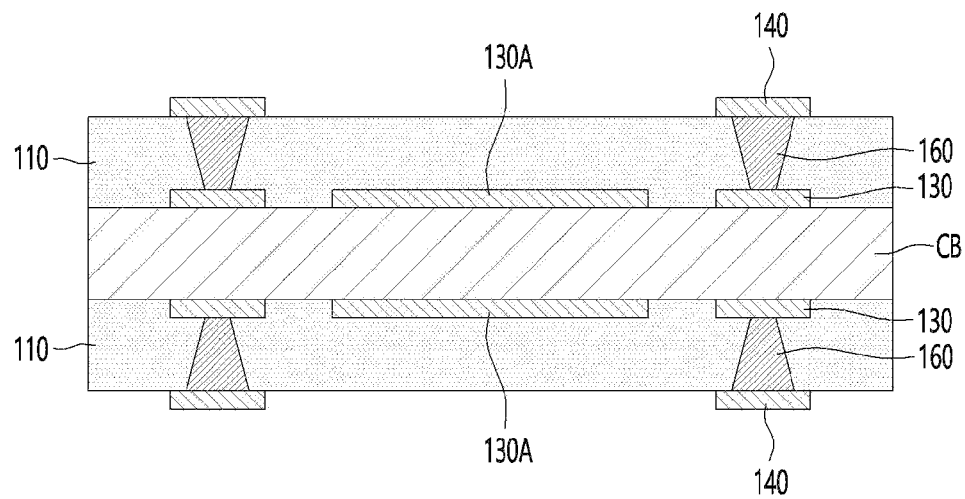

Next, referring to FIG. 5, when the via hole VH is formed, the first via 160 passing through the first insulating layer 110 may be formed by filling an inside of the formed via hole VH with a metal material. Also, along with the formation of the first via 160, a second circuit pattern 140 may be formed on the surface of the first insulating layer 110. Accordingly, the first via 160 may electrically connect the first circuit pattern 130 and the second circuit pattern 140 to each other.

Figure 6:
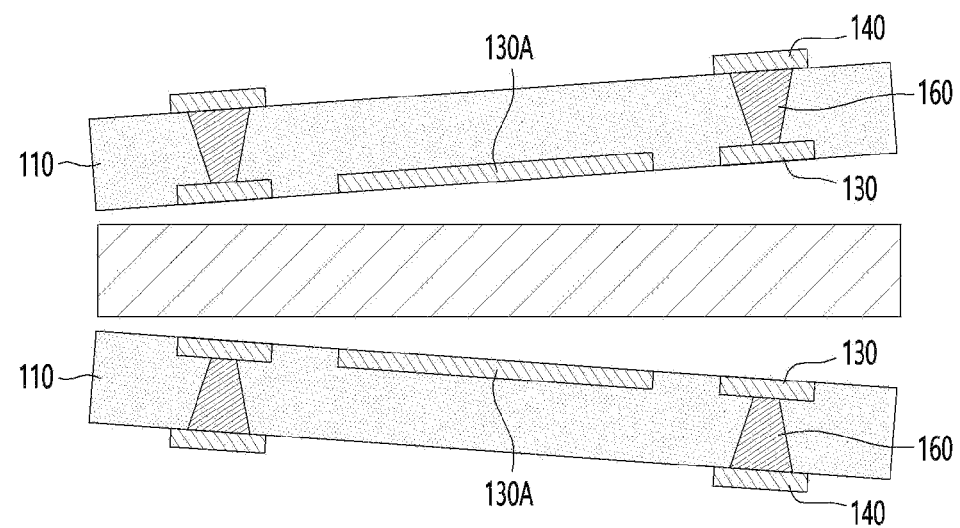

Next, referring to FIG. 6, a substrate formed on the upper portion and a substrate formed under the lower portion may be separated from each other with respect to the carrier board CB. That is, in the first embodiment, a plurality of substrates are simultaneously manufactured on both sides of the carrier board CB in a state in which the carrier board CB is disposed only until the process of forming the first circuit pattern 130, the cavity pattern 130A, the second circuit pattern 140, the first via 160, and the first insulating layer 110.

Figure 7:
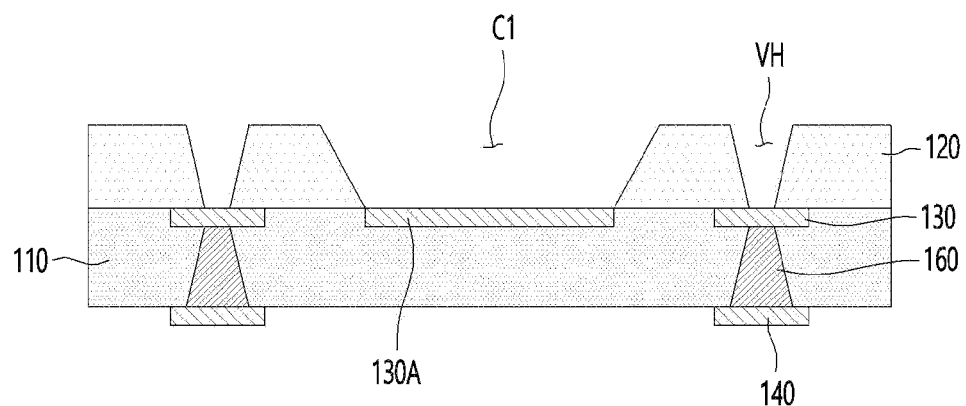

Next, referring to FIG. 7, when the carrier board CB is separated, a second insulating layer 120 is formed on the upper surface of the first insulating layer 110 to cover the upper surface of the first circuit pattern 130 buried in the upper portion of the first insulating layer 110.

In this case, the second insulating layer 120 may be formed of a photosensitive insulating resin.

Further, when the second insulating layer 120 is formed, the via hole VH and the first portion C1 of the cavity C may be formed in the second insulating layer 120.

In this case, the via hole VH and the first portion C1 of the cavity C may be simultaneously formed on the second insulating layer 120 by performing an exposure and development process.

Also, the first portion C1 of the cavity C may overlap the cavity pattern 130A buried in the upper portion of the first insulating layer 110 in a vertical direction.

In this case, the depth of the first portion C1 of the cavity C may be the same as the thickness of the second insulating layer 120. That is, the first portion C1 of the cavity C may be formed to pass through the second insulating layer 120. Accordingly, the upper surface of the cavity pattern 130A buried in the upper portion of the first insulating layer 110 may be exposed through the first portion C1 of the cavity C.

In this case, the first portion C1 of the cavity C is formed by exposing and developing the second insulating layer 120 made of the photosensitive insulating resin as described above, and thus may have a first cross-sectional shape. For example, the first portion C1 of the cavity C may have a trapezoidal cross-sectional shape in which the inner wall has a predetermined inclination with respect to the main surface.

Figure 8:
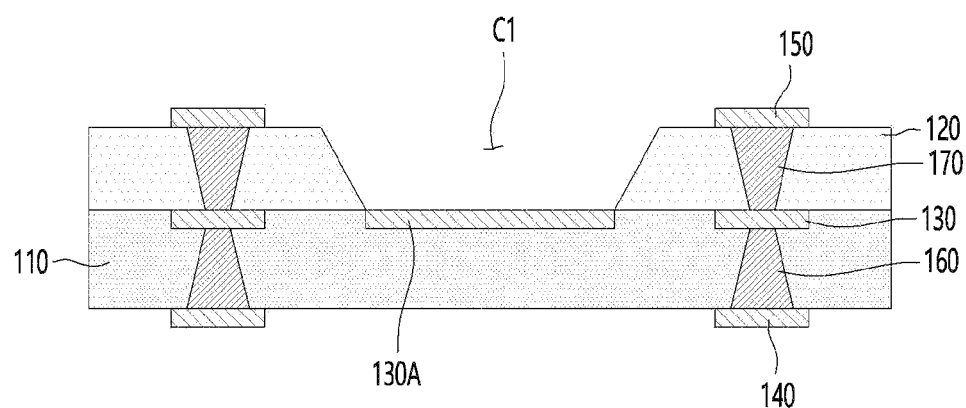

Next, referring to FIG. 8, the second via 170 may be formed by filling the via hole VH formed in the second insulating layer 120 with a metal material.

In addition, a process of forming the third circuit pattern 150 on the upper surface of the second insulating layer 120 may be performed together with the formation of the second via 170.

Figure 9:
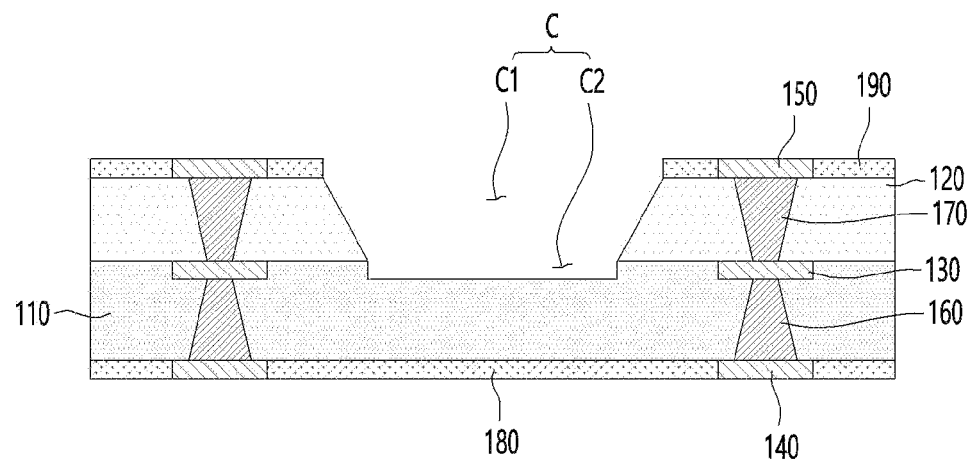

Next, referring to FIG. 9, a process of removing the cavity pattern 130A exposed through the first portion C1 of the cavity C may be performed. The process of removing the cavity pattern 130A may be performed using an etchant that etches a metal material constituting the cavity pattern 130A. In this case, a mask (not shown) for protecting the third circuit pattern 150 may be disposed on the upper surface of the second insulating layer 120, and the process of removing the cavity pattern 130A may be performed in a state in which the mask is disposed.

As the cavity pattern 130A is removed, the region where the cavity pattern 130A is disposed forms a second portion C2 connected to the first portion C1 of the cavity C, accordingly, as the first portion C1 and the second portion C2 are connected, one cavity C may be formed.

In this case, the second portion C2 of the cavity C may have a second cross-sectional shape. That is, the second portion C2 may have a second cross-sectional shape different from the first cross-sectional shape of the first portion C1. The second cross-sectional shape may be the same as the cross-sectional shape of the first circuit pattern 130. For example, the second cross-sectional shape of the second portion C2 may be a quadrangular shape.

When the second portion C2 of the cavity C is formed, the first protective layer 180 and the second protective layer 190 may be formed under the lower surface of the first insulating layer 110 and the upper surface of the second insulating layer 120, respectively.

According to an embodiment, an outermost insulating layer of the printed circuit board is formed of a photoimageable dielectric (PID). Then, a cavity in which the device can be mounted is formed in the outermost insulating layer, and the device can be mounted in the formed cavity.

Accordingly, as at least a part of the device is disposed in the outermost insulating layer of the printed circuit board, it is possible to reduce the overall thickness of the package substrate by the depth of the cavity. In addition, according to an embodiment, as the insulating layer in which the cavity is formed is composed of photoimageable dielectics (PID), and it is possible to easily form a cavity for device mounting through exposure and development, accordingly, it is possible to solve a reliability problem that may occur when the cavity is formed.

Further, according to an embodiment, a cavity pattern is formed together with a circuit pattern when the circuit pattern to be embedded in the insulating layer is formed. Then, a cavity is formed in the insulating layer by removing the formed cavity pattern. Accordingly, it is possible to solve the problem that the glass fiber included in the insulating layer is exposed through the cavity depending on the material forming the insulating layer, thereby improving the reliability of the cavity.

Further, according to an embodiment, a depth of the entire cavity can be easily adjusted through a combination of a first portion of the cavity formed on the photosensitive insulating resin and a second portion of the cavity formed in a non-photosensitive insulating resin.

In addition, according to the embodiment, it is possible to remove a process such as a laser process or sand blasting, which must be essentially included in forming the cavity, thereby simplifying the manufacturing process and remarkably reducing the manufacturing cost.

Meanwhile, the printed circuit board according to the first embodiment as described above may constitute an upper substrate in a package substrate including a lower substrate and an upper substrate. For example, an electronic component may be mounted on the upper portion of the lower substrate, and the upper substrate corresponding to the printed circuit board according to the first embodiment may be attached under the lower substrate, accordingly, at least a portion of the electronic component may be disposed in the cavity C formed in the upper substrate.

Meanwhile, the printed circuit board according to the first embodiment as described above includes the first portion C1 and the second portion C2 having the cavity C formed in the the second insulating layer 120 made of the photosensitive insulating resin and the first insulating layer 110 made of the non-photosensitive insulating resin, respectively.

Alternatively, the cavity C of the printed circuit board may include only one of the first portion C1 and the second portion C2.

Hereinafter, a printed circuit board including a cavity C including only the second portion C2 (second embodiment) and a printed circuit board including a cavity C including only the first portion C1 (third embodiment) will be described.

Figure 10:
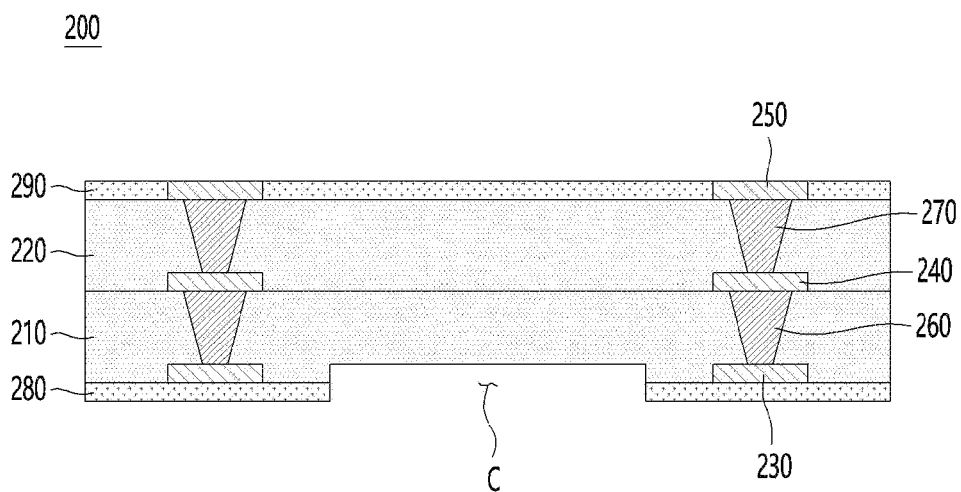
FIG. 10 is a view showing a printed circuit board according to a second embodiment.

FIG. 10 is a view showing a printed circuit board according to the second embodiment.

Referring to FIG. 10, the printed circuit board 200 may include a plurality of insulating layers 210 and 220.

The plurality of insulating layers 210 and 220 have a mutually stacked structure.

Preferably, the plurality of insulating layers 210 and 220 may include a first insulating layer 210 and a second insulating layer 220.

The first insulating layer 210 and the second insulating layer 220 may be made of different insulating resins, or alternatively, may be made of the same insulating resin.

For example, the first insulating layer 210 may be made of a non-photosensitive insulating resin.

Specifically, the first insulating layer 210 may include glass or plastic. In detail, the first insulating layer 210 may include chemically strengthened/semi-tempered glass such as soda lime glass or aluminosilicate glass, or containing reinforced or flexible plastics such as polyimide (PI), polyethylene terephthalate (PET), propylene glycol (PPG), polycarbonate (PC), or sapphire.

The first insulating layer 210 may include a material such as Liquid Crystal Polymer (LCP), PPG (FR1,2,3,4), Teflon, Ajinomoto build up film (ABF), Resin Coated Copper (RCC), and the like. However, the embodiment is not limited thereto. As an example, the first insulating layer 210 may include any one of a prepreg (PPG), Ajinomoto build-up film (ABF), a copper foil coating resin (RCC, Resin Coated Copper), a liquid crystal polymer (LCP, Liquid Crystal Polymer), and Teflon.

In addition, the first insulating layer 210 may include glass therein to ensure rigidity.

The second insulating layer 220 may be disposed on the first insulating layer 210. The second insulating layer 220 may be formed of a non-photosensitive insulating resin in the same manner as the first insulating layer 210. Also, the second insulating layer 220 may be formed of a photosensitive insulating resin differently from the first insulating layer 210.

On the other hand, the printed circuit board 200 in the embodiment includes a cavity (C). In this case, the cavity C may be formed in the first insulating layer 210.

The cavity C may be a recess concave from a lower portion to an upper portion of the first insulating layer 210.

The cavity C may have the same cross-sectional shape as the first circuit pattern 230.

For example, an inner wall of the cavity C may be perpendicular to the main surface. For example, the cross-sectional shape of the cavity C may be a rectangular shape.

Meanwhile, the depth of the cavity C may correspond to the thickness of the first circuit pattern 230 buried under the first insulating layer 210. Preferably, the cavity C may be formed by removing a cavity pattern (described later) formed together with the first circuit pattern 230 when the first circuit pattern 230 is formed. Accordingly, the depth of the cavity C may correspond to the thickness of the first circuit pattern 230. For example, the depth of the cavity C may be the same as the thickness of the first circuit pattern 230.

In the embodiment, when forming the first circuit pattern 230 to be buried in the upper portion of the first insulating layer 210 as described above, a cavity pattern is formed together with the first circuit pattern 130. Then, the cavity pattern is removed to form the cavity C in the first insulating layer 210. At this time, when the cavity is formed by removing the surface of the first insulating layer 210 through laser or sand blasting, glass present in the first insulating layer 210 may be exposed to an outside, and the exposed glass may affect the reliability of the cavity (C).

Alternatively, in the embodiment, the cavity C is formed by removing the cavity pattern disposed in the first insulating layer 210, rather than removing the first insulating layer 210. Therefore, in the embodiment, it is possible to solve the problem that the glass fiber included in the insulating layer is exposed through the cavity, and thus the reliability of the cavity can be improved.

In addition, according to the embodiment, it is possible to remove a process such as a laser process or sand blasting, which must be essentially included in forming the cavity, thereby simplifying the manufacturing process and remarkably reducing the manufacturing cost.

Meanwhile, a circuit pattern layer is disposed on the surfaces of the first insulating layer 210 and the second insulating layer 220.

The circuit pattern layer may include a first circuit pattern 230 buried under the first insulating layer 210, a second circuit pattern 240 disposed on an upper surface of the first insulating layer 210, and a third circuit pattern 250 disposed on the upper surface of the second insulating layer 220.

The first circuit pattern 230 may be disposed to be buried in a lower portion of the first insulating layer 210. In other words, the lower surface of the first circuit pattern 230 may be positioned on the same plane as the lower surface of the first insulating layer 210.

The second circuit pattern 240 may have a structure protruding above the upper surface of the first insulating layer 210. In addition, the third circuit pattern 250 may have a structure that protrudes above the upper surface of the second insulating layer 220.

As described above, the first to third circuit patterns 230, 240, and 250 disposed on the surface of each insulating layer may be formed of a metal material having high electrical conductivity. To this end, the first to third circuit patterns 230, 240, and 250 may be formed of at least one metal material selected from gold (Au), silver (Ag), platinum (Pt), titanium (Ti), tin (Sn), copper (Cu), and zinc (Zn). In addition, the first to third circuit patterns 230, 240, and 250 may be formed of a paste or solder paste including at least one metal material selected from gold (Au), silver (Ag), platinum (Pt), titanium (Ti), tin (Sn), copper (Cu), and zinc (Zn) having excellent bonding strength. Preferably, the first to third circuit patterns 230, 120, and 250 may be formed of copper (Cu), which has high electrical conductivity and is relatively inexpensive.

The first to third circuit patterns 230, 240, and 250 may be formed by an additive process, a subtractive process, a modified semi additive process (MSAP) and a semi additive process (SAP) method, which is a typical printed circuit board manufacturing process, and a detailed description thereof will be omitted herein.

Meanwhile, vias 260 and 270 for electrically connecting circuit patterns disposed on different layers may be disposed in each insulating layer. The vias 260 and 270 may be disposed to pass through each insulating layer, and accordingly, circuit patterns disposed on surfaces of different insulating layers may be electrically connected to each other.

Meanwhile, a first protective layer 280 may be disposed under a lower surface of the first insulating layer 210, and a second protective layer 290 may be disposed on an upper surface of the second insulating layer 220. The first protective layer 280 may be disposed under the lower surface of the first insulating layer 210 to protect the lower surface of the first insulating layer 210. Also, the first protective layer 280 may be disposed to cover at least a part of the lower surface of the first circuit pattern 230 disposed under the lower surface of the first insulating layer 210.

In addition, the second protective layer 290 may be disposed on the upper surface of the second insulating layer 220, but is not limited thereto. That is, the second protective layer 290 is also made of the same photosensitive insulating resin as the second insulating layer 220. Accordingly, the second protective layer 290 may be selectively omitted. However, in order to protect the surface of the third circuit pattern 250 disposed on the upper surface of the second insulating layer 220, the second protective layer 290 may be selectively disposed on the second insulating layer 220.

The first passivation layer 280 and the second protective layer 290 may include an insulating material.

The first protective layer 280 and the second protective layer 290 may include various materials that can be cured by heating after being applied to protect the surface of the circuit pattern. The first protective layer 280 and the second protective layer 290 may be a resist layer. For example, the first protective layer 280 and the second protective layer 290 may be a solder resist layer including an organic polymer material. For example, the first protective layer 280 and the second protective layer 290 may include an epoxy acrylate-based resin. In detail, the first protective layer 280 and the second protective layer 290 may include a resin, a curing agent, a photoinitiator, a pigment, a solvent, a filler, an additive, an acryl-based monomer, and the like. However, the embodiment is not limited thereto, and the first protective layer 280 and the second protective layer 290 may be any one of a photo-solder resist layer, a coverlay, and a polymer material.

A thickness of the first protective layer 280 and the second protective layer 290 may be 1 µm to 20 µm. The thickness of the first protective layer 280 and the second protective layer 290 may be 1 µm to 15 µm. For example, the thickness of the first protective layer 280 and the second protective layer 290 may be 5 µm to 20 µm. When the thickness of the first protective layer 280 and the second protective layer 290 is greater than 20 µm, the thickness of the printed circuit board may increase. When the thickness of the first protective layer 280 and the second protective layer 290 is less than 1 µm, the reliability of the circuit pattern may be deteriorated.

FIGS. 11 to 17 are cross-sectional views illustrating a method of manufacturing a printed circuit board according to the second embodiment shown in FIG. 10 in order of process.

First, the method of manufacturing a printed circuit board may be performed as a process of simultaneously manufacturing a plurality of printed circuit boards on both sides of the carrier board CB with a member such as the carrier board CB interposed therebetween.

Figure 11:
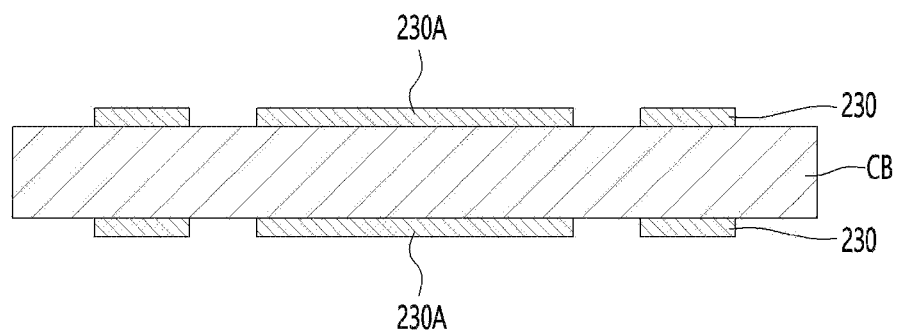
FIGS. 11 to 17 are cross-sectional views showing a method of manufacturing the printed circuit board according to the second embodiment shown in FIG. 10 in order of process.

Referring to FIG. 11, in the method of manufacturing a printed circuit board, a process of preparing a carrier board CB and forming a first circuit pattern 230 on an upper surface and a lower surface of the carrier board CB may be performed, respectively. In this case, a cavity pattern 230A may be formed on the upper and lower surfaces of the carrier board CB together with the first circuit pattern 230. In this case, the cavity pattern 230A may be formed together with the first circuit pattern 230. Preferably, the cavity pattern 230A may be formed of the same metal material as the first circuit pattern 230.

Figure 12:
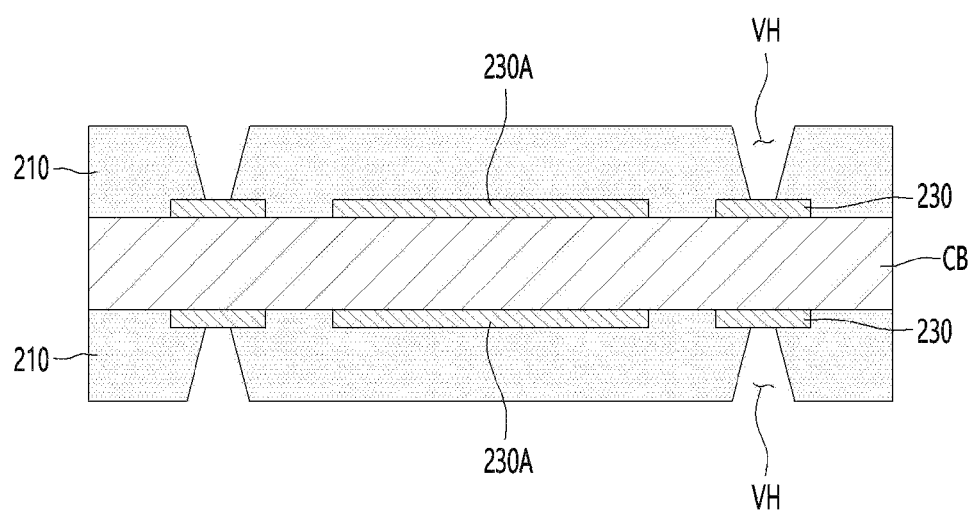

Next, referring to FIG. 12, when the cavity pattern 230A and the first circuit pattern 230 are formed, the first insulating layer 210 may be formed on the upper and lower surfaces of the carrier board CB, respectively. In this case, the first insulating layer 210 may be formed of a non-photosensitive material as described above. For example, the first insulating layer 210 may be formed of a prepreg.

In addition, when the first insulating layer 210 is formed, the first insulating layer 210 may be processed to form a via hole VH. In this case, the first insulating layer 210 is formed of a prepreg, and accordingly, the via hole VH may be formed by a laser process.

Figure 13:
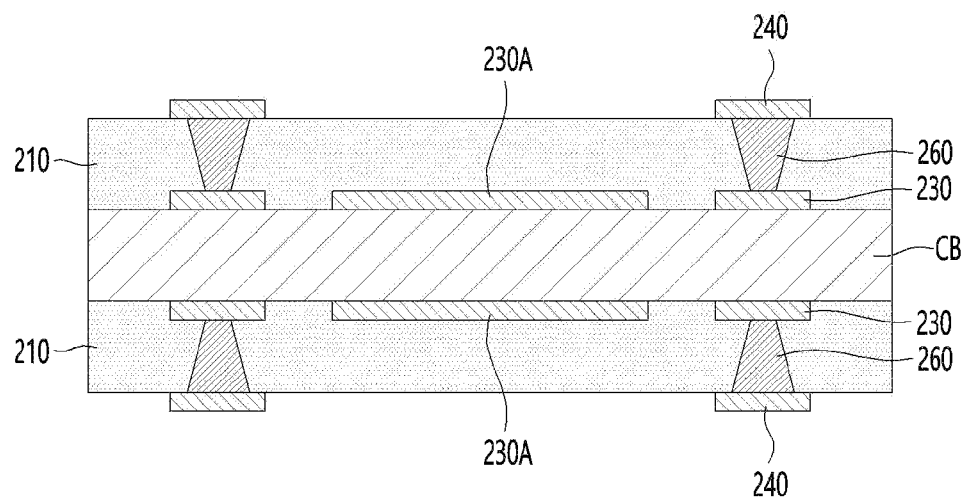

Next, referring to FIG. 13, when the via hole VH is formed, the first via 260 passing through the first insulating layer 210 may be formed by filling an inside of the formed via hole VH with a metal material. Also, along with the formation of the first via 260, a second circuit pattern 240 may be formed on the surface of the first insulating layer 210. Accordingly, the first via 260 may electrically connect the first circuit pattern 230 and the second circuit pattern 240 to each other.

Figure 14:
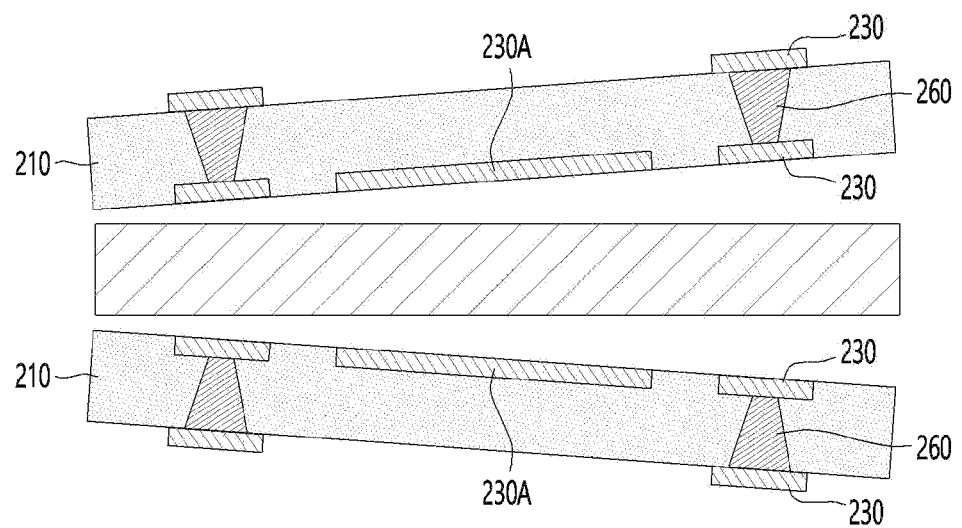

Next, referring to FIG. 14, a substrate formed on the upper portion and a substrate formed under the lower portion may be separated from each other with respect to the carrier board CB. That is, in the first embodiment, a plurality of substrates are simultaneously manufactured on both sides of the carrier board CB in a state in which the carrier board CB is disposed only until the process of forming the first circuit pattern 230, the cavity pattern 230A, the second circuit pattern 240, the first via 260, and the first insulating layer 210.

Figure 15:
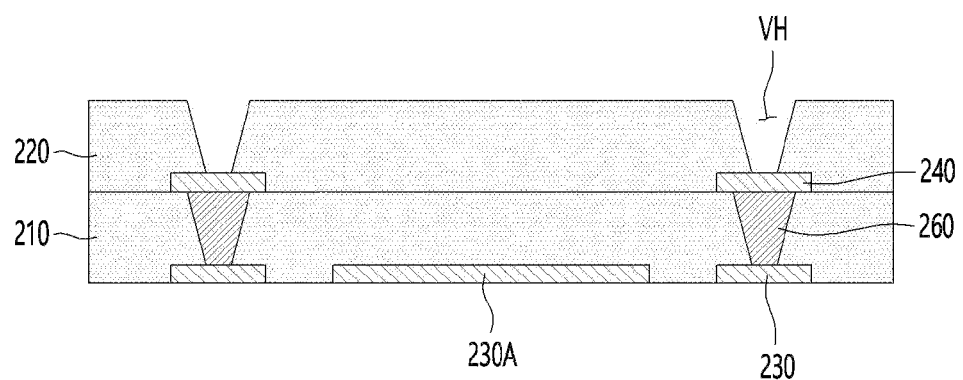

Next, referring to FIG. 15, when the carrier board CB is separated, the second insulating layer 220 covering the upper surface of the second circuit pattern 240 disposed on the upper surface of the first insulating layer 210 is formed on the upper surface of the first insulating layer 210.

In this case, the second insulating layer 220 may be formed of a photosensitive insulating resin, or alternatively, may be formed of a non-photosensitive insulating resin.

Also, when the second insulating layer 220 is formed, a via hole VH may be formed on the second insulating layer 220.

Figure 16:
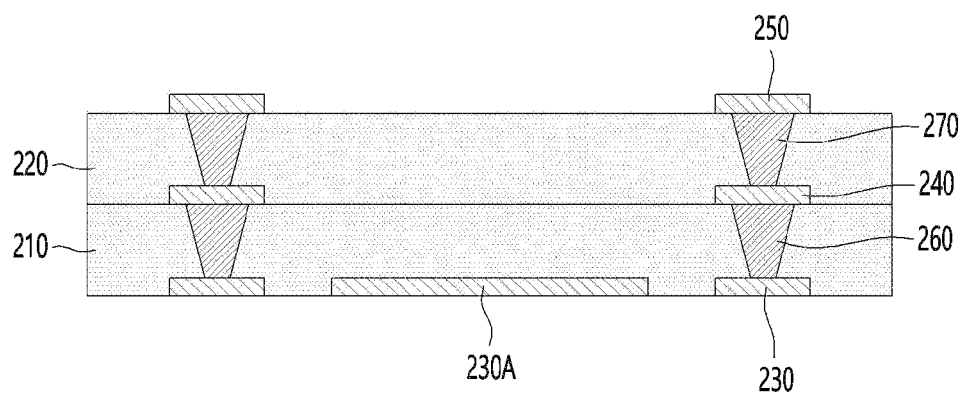

Next, referring to FIG. 16, the second via 270 may be formed by filling the via hole VH formed in the second insulating layer 220 with a metal material.

In addition, a process of forming the third circuit pattern 250 on the upper surface of the second insulating layer 220 may be performed together with the formation of the second via 270.

Figure 17:
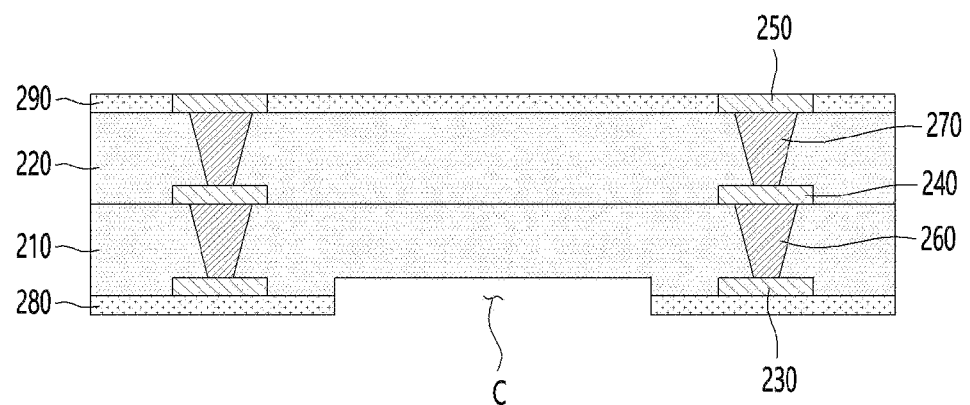

Next, referring to FIG. 17, a process of removing the cavity pattern 230A buried in a lower region of the first insulating layer 210 may be performed. The process of removing the cavity pattern 230A may be performed using an etchant that etches a metal material constituting the cavity pattern 230A. In this case, a mask (not shown) for protecting the first circuit pattern 230 may be disposed under the lower surface of the first insulating layer 210, and the process of removing the cavity pattern 230A may be performed in a state in which the mask is disposed.

As the cavity pattern 230A is removed, a region in which the cavity pattern 230A is disposed may be opened to constitute the cavity C.

In this case, the cross-sectional shape of the cavity C may have the same cross-sectional shape as the first circuit pattern 230, for example, may have a rectangular shape.

When the cavity C is formed, a first protective layer 280 and a second protective layer 290 may be formed under the lower surface of the first insulating layer 210 and the upper surface of the second insulating layer 220, respectively.

Figure 18:
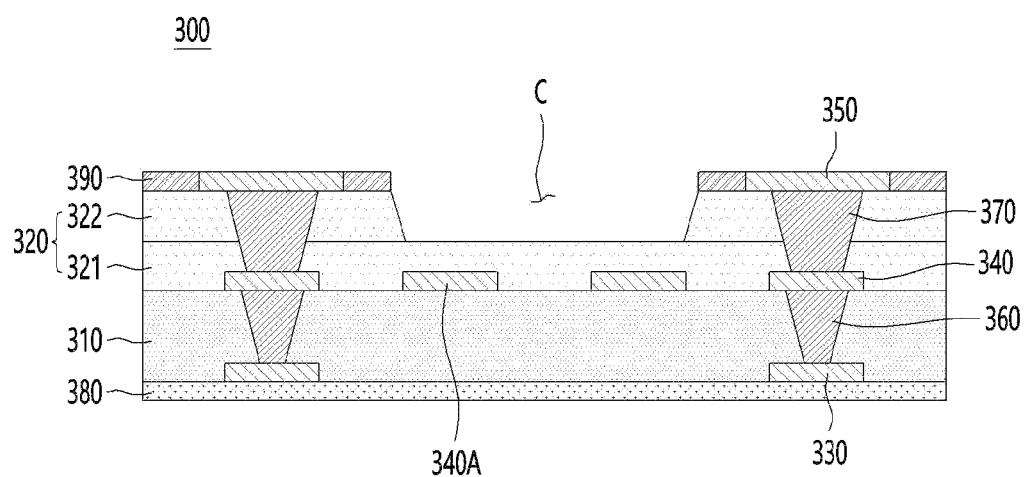
FIG. 18 is a view showing a printed circuit board according to a third embodiment.

FIG. 18 is a view showing a printed circuit board according to a third embodiment.

Hereinafter, descriptions of the same portions as those of the printed circuit boards of the first and second embodiments described with reference to FIGS. 2 and 10 will be omitted.

Referring to FIG. 18, the printed circuit board 300 includes a first insulating layer 310 and a second insulating layer 320.

The second insulating layer 320 is disposed on the first insulating layer 310.

At this time, in the printed circuit board according to the first embodiment, in order to form the second portion C2 of the cavity C on the upper surface of the first insulating layer 110, the arrangement of the circuit pattern was impossible. Accordingly, a circuit density in the portion where the second portion C2 of the cavity C is formed may be reduced.

Unlike this, in the third embodiment, the circuit pattern can be formed on the upper surface of the first insulating layer 310 to improve the circuit density.

To this end, the second insulating layer 320 includes a first insulating part 321 disposed on the upper surface of the first insulating layer 310 and a second insulating part 322 disposed on the upper surface of the first insulating part 321.

A second circuit pattern 340 is disposed on the upper surface of the first insulating layer 310. In this case, the second circuit pattern 340 may include a circuit pattern 340A disposed in a region overlapping the cavity C in a vertical direction.

In this case, the first insulating part 321 may be disposed to have a predetermined thickness on the upper surface of the first insulating layer 310, thereby covering the second circuit patterns 340 and 340A. That is, the thickness of the first insulating part 321 may be greater than the thickness of the second circuit patterns 340 and 340A, and accordingly, the upper surface of the first insulating part 321 may be higher than upper surface of second circuit pattern 340, 340A.

The second insulating part 322 may be disposed on the upper surface of the first insulating part 321.

In addition, the cavity C in the printed circuit board 300 may be formed in the second insulating part 322.

In this case, the second insulating part 322 may be formed of a photosensitive insulating resin. Accordingly, the cavity C may be formed by exposing and developing the second insulating part 322. Accordingly, the cavity C may have a trapezoidal shape in a vertical cross-section.

Meanwhile, the first insulating part 321 may be formed of a photosensitive insulating resin, or alternatively, may be formed of a non-photosensitive insulating resin.

In this case, when the first insulating part 321 is formed of a non-photosensitive insulating resin, the first insulating part 321 is not removed when the cavity C is formed, and accordingly, the cavity C may be formed by removing only the second insulating part 322.

However, when the first insulating part 321 is formed of a photosensitive insulating resin, the first insulating part 321 may be removed when the cavity C is formed. Accordingly, when the first insulating part 321 is formed of a photosensitive insulating resin, the second insulating part 322 may be stacked after the first insulating part 321 is completely cured. In addition, when the cavity C is formed by exposing and developing the second insulating part 322, the first insulating part 321 is not removed because it is fully cured, and accordingly, the cavity C may be formed by removing only the second insulating part 322.

Meanwhile, a first via 360 may be disposed in the first insulating layer 310, and a second via 370 may be disposed in the second insulating layer 320.

In this case, the second via 370 includes a first via part 371 passing the first insulating part 321 of the second insulating layer 320, and a second via part 372 passing the second insulating part 322 of the second insulating layer 320.

In addition, a first protective layer 380 may be disposed under a lower surface of the first insulating layer 310, and a second protective layer 390 may be disposed on an upper surface of the second insulating layer 320.

FIGS. 19 to 23 are views showing a method manufacturing the printed circuit board shown in FIG. 18 in order of process.

Figure 19:
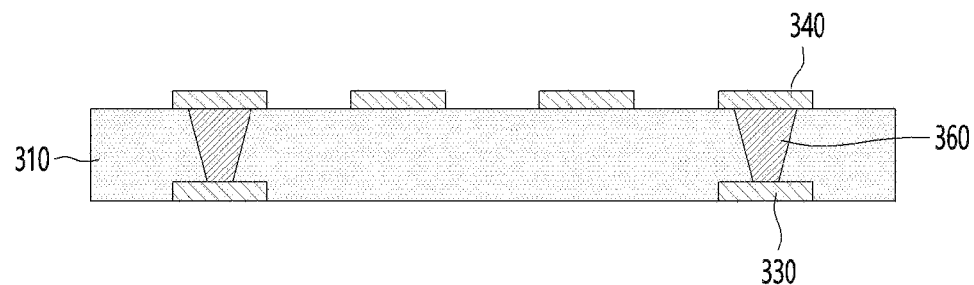
FIGS. 19 to 23 are views showing a method manufacturing the printed circuit board shown in FIG. 18 in order of process.

Referring to FIG. 19, a first insulating layer 310 is prepared, and a first circuit pattern 330 buried in a lower portion of the first insulating layer 310, a second circuit pattern 340 disposed on the upper surface of the first insulating layer 310 and a first via 360 passing through the first insulating layer 310 is formed.

Figure 20:
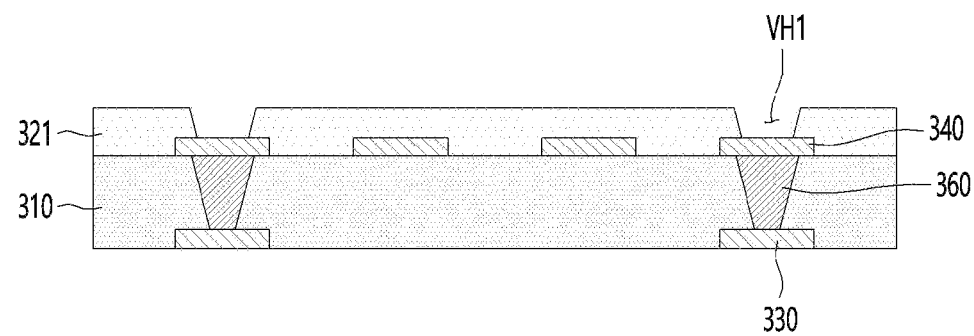

Next, referring to FIG. 20, a first insulating part 321 of the second insulating layer 320 is formed on the upper surface of the first insulating layer 310.

In this case, the first insulating part 321 may be formed of a photosensitive insulating resin, or alternatively, may be formed of a non-photosensitive insulating resin.

Thereafter, a first via hole VH1 is formed in the first insulating part 321. Here, when the first insulating part 321 is formed of a photosensitive insulating resin, the first via hole VH1 may be formed by a photolithography process such as an exposure and development process. Alternatively, when the first insulating part 321 is formed of a non-photosensitive insulating resin, the first via hole VH1 may be formed by a laser process.

Figure 21:
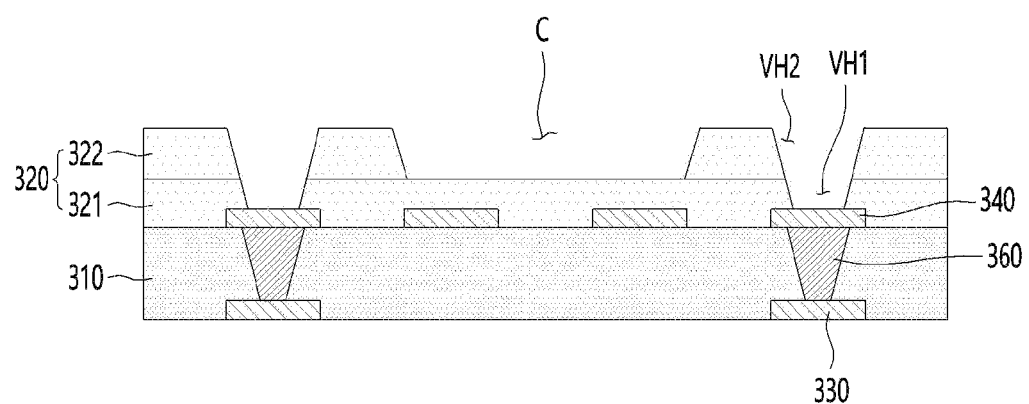

Next, referring to FIG. 21, a second insulating part 322 is formed on the first insulating part 321. In this case, the second insulating part 322 may be formed of a photosensitive insulating resin.

Then, by exposing and developing the second insulating part 322, a second via hole VH2 overlapping the first via hole VH1 in the vertical direction is formed in the second insulating part 322. Also, when the second via hole VH2 is formed, a cavity C passing through the second insulating part 322 may be formed together.

Figure 22:
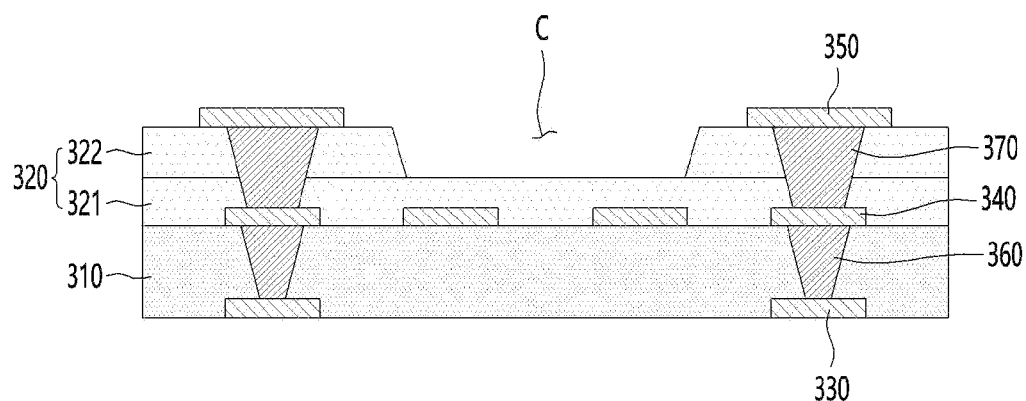

Next, referring to FIG. 22, a second via 370 may be formed by filling the first and second via holes VH1 and VH2 with a metal material. Also, when the second via 370 is formed, a third circuit pattern 350 may be formed on the upper surface of the second insulating layer 320. In this case, the second via 370 may be include a first via part 371 disposed to pass through the first insulating part 321, and a second via part 372 directly connected to the first via part 31 and disposed to pass through the second insulating part 322.

Also, the cavity C may be disposed in a region overlapping with the second circuit pattern 340 disposed on the first insulating layer 310 in a vertical direction. However, a first insulating part 321 is disposed on the first insulating layer 310, and the cavity C is formed in a second insulating part 322 disposed on the first insulating part 321. Accordingly, the second circuit pattern 340 may be protected by the first insulating part 321, and a reliability problem occurring when the cavity C is formed may be solved.

Figure 23:
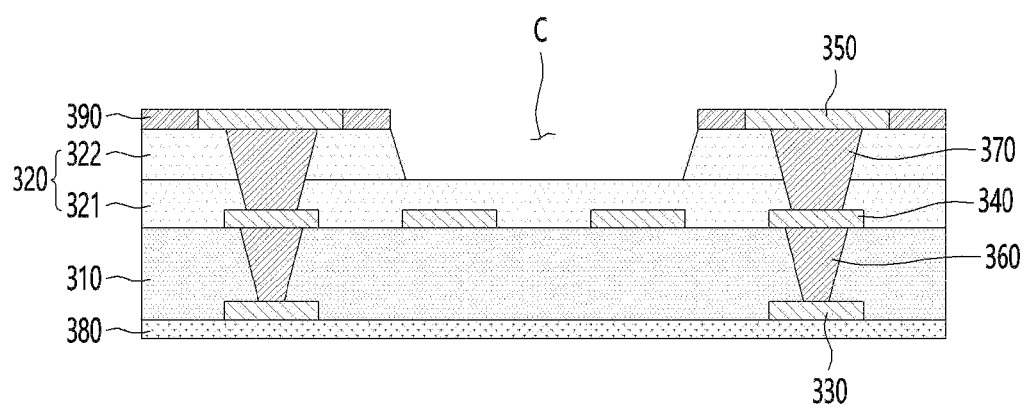

Next, referring to FIG. 23, a first protective layer 380 is formed under the lower surface of the first insulating layer 310, and a second protective layer 390 is formed on the upper surface of the second insulating layer 320.

According to an embodiment, an outermost insulating layer of the printed circuit board is formed of a photoimageable dielectric (PID). Then, a cavity in which the device can be mounted is formed in the outermost insulating layer, and the device can be mounted in the formed cavity.

Accordingly, as at least a part of the device is disposed in the outermost insulating layer of the printed circuit board, it is possible to reduce the overall thickness of the package substrate by the depth of the cavity. In addition, according to an embodiment, as the insulating layer in which the cavity is formed is composed of photoimageable dielectics (PID), and it is possible to easily form a cavity for device mounting through exposure and development, accordingly, it is possible to solve a reliability problem that may occur when the cavity is formed.

Further, according to an embodiment, a cavity pattern is formed together with a circuit pattern when the circuit pattern to be embedded in the insulating layer is formed. Then, a cavity is formed in the insulating layer by removing the formed cavity pattern. Accordingly, it is possible to solve the problem that the glass fiber included in the insulating layer is exposed through the cavity depending on the material forming the insulating layer, thereby improving the reliability of the cavity.

Further, according to an embodiment, a depth of the entire cavity can be easily adjusted through a combination of a first portion of the cavity formed on the photosensitive insulating resin and a second portion of the cavity formed in a non-photosensitive insulating resin.

In addition, according to the embodiment, it is possible to remove a process such as a laser process or sand blasting, which must be essentially included in forming the cavity, thereby simplifying the manufacturing process and remarkably reducing the manufacturing cost.

Figure 24:
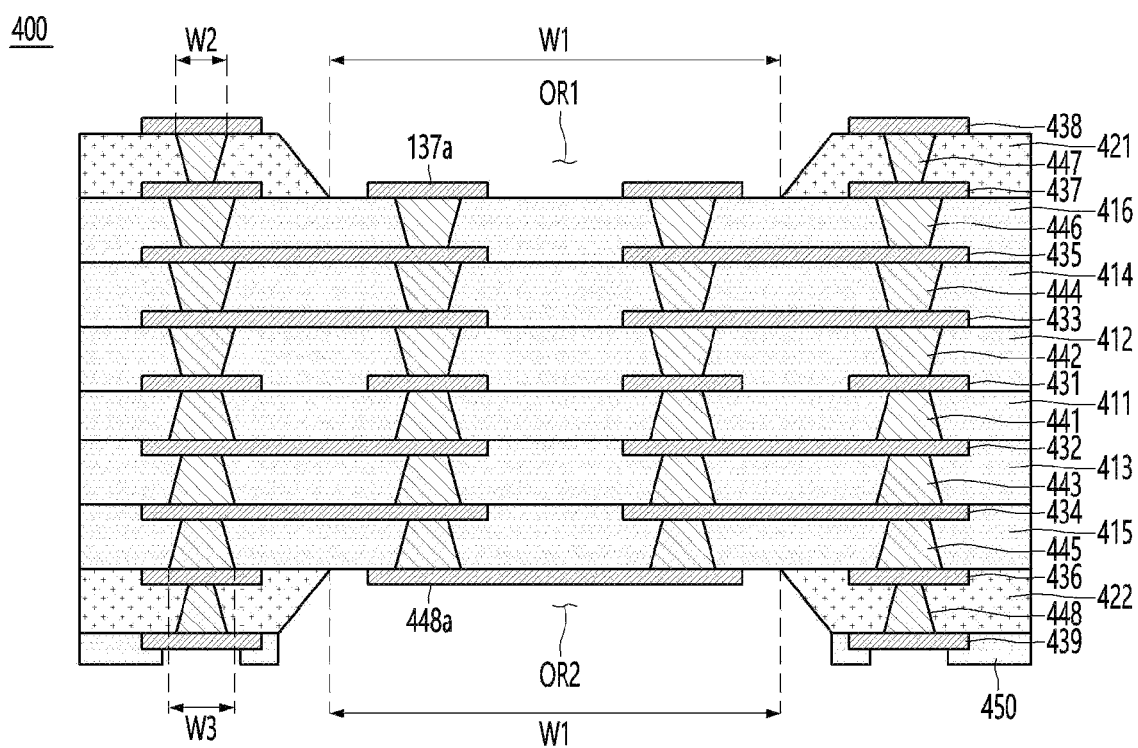
FIG. 24 is a view showing a printed circuit board according to a fourth embodiment.

FIG. 24 is a view showing a printed circuit board according to a fourth embodiment.

Referring to FIG. 24, the printed circuit board may include a plurality of insulating layers 411, 412, 413, 414, 415, 416, 421, and 422.

In this case, some of the insulating layers 411, 412, 413, 414, 415, 416 of the plurality of insulating layers 411, 412, 413, 414, 415, 416, 421, and 422 may be referred to as a first insulating portion or an internal insulating layer or an intermediate insulating layer of an inner layer, and the remaining partial insulating layers 421 and 422 may be referred to as a second insulating portion/third insulating portion or an external insulating layer or an outer insulating layer or an upper insulating layer/lower insulating layer or an external layer.

Hereinafter, the plurality of insulating layers 411, 412, 413, 414, 415, 416, 421, and 422 will be described by dividing them into first to eighth insulating layers. However, as described above, some of the insulating layers 411, 412, 413, 414, 415, 416 disposed therein among the plurality of insulating layers 411, 412, 413, 414, 415, 416, 421, 422 may be referred to as a first insulating portion, the seventh insulating layer 421 disposed on the first insulating portion may be referred to as a second insulating portion, and the eighth insulating layer 422 disposed under the first insulating portion may be referred to as a third insulating portion.

In addition, circuit patterns and vias may be respectively disposed on and in the plurality of insulating layers 411, 412, 413, 414, 415, 416, 421, and 422.

In this case, hereinafter, circuit patterns disposed on the plurality of insulating layers 411, 412, 413, 414, 415, 416, 421, and 422 are divided into first to ninth circuit patterns according to positions. However, a circuit pattern disposed on the surface of the first insulating portion among the plurality of circuit patterns may be referred to as a first circuit pattern portion, and a circuit pattern disposed on the surface of the second insulating portion may be referred to as a second circuit pattern portion, and a circuit pattern disposed on the surface of the third insulating portion may be referred to as a third circuit pattern portion. Also, similarly, a via disposed in the first insulating portion among the plurality of vias may be referred to as a first via portion, a via disposed in the second insulating portion may be referred to as a second via portion, and a via disposed in the third insulating portion may be referred to as a second via portion.

The printed circuit board 400 represents a wiring diagram of electrical wiring connecting circuit parts based on the circuit design, and the electrical conductors on the insulating layers 411, 412, 413, 414, 415, 416, 421, 422 can be reproduced. In addition, the printed circuit board 400 may mount devices such as electrical components, form wirings for connecting them in a circuit, and mechanically fix components other than the electrical connection function of the components.

The insulating layers 411, 412, 413, 414, 415, 416, 421, and 422 have a mutually stacked structure.

Preferably, the insulating layers 411, 412, 413, 414, 415, 416, 421, 422 may include a first insulating layer 411, a second insulating layer 412, a third insulating layer 413, a fourth insulating layer 414, a fifth insulating layer 415, a sixth insulating layer 416, a seventh insulating layer 421, and an eighth insulating layer 422.

That is, the printed circuit board 400 in the embodiment has a 9-layer structure based on the circuit pattern layer. Accordingly, the printed circuit board 400 in the embodiment may include the insulating layers 411, 412, 413, 414, 415, 416, 421, 422 having an 8-layer structure so that a circuit pattern can be disposed on the surface.

At this time, among the insulating layers 411, 412, 413, 414, 415, 416, 421, and 422, the first insulating layer 411, the second insulating layer 412, the third insulating layer 413, and the fourth insulating layer 414, the fifth insulating layer 415, and the sixth insulating layer 416 may be referred to as internal insulating layers. In addition, the seventh insulating layer 421 and the eighth insulating layer 422 may be referred to as an external insulating layer or an outermost insulating layer.

That is, the seventh insulating layer 421 may be disposed on the sixth insulating layer 416 disposed on an uppermost of the internal insulating layers.

Also, the eighth insulating layer 422 may be disposed under the fifth insulating layer 415 disposed under a lowermost of the internal insulating layers.

The first insulating layer 411, the second insulating layer 412, the third insulating layer 413, the fourth insulating layer 414, the fifth insulating layer 415, and the sixth insulating layer 416 may include a prepreg.

The seventh insulating layer 421 may be an insulating layer disposed at an uppermost of the plurality of insulating layers constituting the printed circuit board 400. The eighth insulating layer 422 may be an insulating layer disposed at a lowermost of the plurality of insulating layers constituting the printed circuit board 400.

In this case, the seventh insulating layer 421 and the eighth insulating layer 422 may include a photosensitive insulating resin.

When the seventh insulating layer 421 and the eighth insulating layer 422 include a photosensitive insulating resin, a protective layer such as a solder resist generally disposed on an outermost of the printed circuit board may be selectively removed.

The seventh insulating layer 421 and the eighth insulating layer 422 include a first opening OR1 and a second opening OR2, respectively.

The seventh insulating layer 421 includes a first opening OR1. The first opening OR1 may be formed by opening the seventh insulating layer 421 in a region where a first device (to be described later) is disposed. Preferably, the first opening OR1 may expose a first lead part 437a disposed in a region where a first device is to be mounted among the circuit patterns 437 disposed on the sixth insulating layer 416.

The eighth insulating layer 422 includes a second opening OR2. The second opening OR2 may be formed by opening the eighth insulating layer 422 in a region where a second device (to be described later) is disposed. Preferably, the second opening OR2 may expose a second lead part 436a disposed in a region where a second device is to be mounted among the circuit patterns 436 disposed under the fifth insulating layer 415.

In this case, the first opening OR1 and the second opening OR2 may be formed by exposing and developing the seventh insulating layer 421 and the eighth insulating layer 422. That is, in the comparative example, when the cavity was formed on the insulating layer, a laser drilling process was generally performed. Accordingly, in the comparative example, damage to the insulating layer or the circuit pattern layer may occur by the laser drilling, and it was difficult to set an accurate position.

On the contrary, in the embodiment, the seventh insulating layer 421 and the eighth insulating layer 422 disposed at the outermost side are made of a photosensitive insulating resin. Based on this, the first opening OR1 and the second opening OR2 may be formed in the seventh insulating layer 421 and the eighth insulating layer 422 by exposure and development processes. In addition, the first opening OR1 and the second opening OR2 may be cavities for mounting the first and second devices on the first and second lead parts 437a and 436a later.

As described above, in the embodiment, the outermost insulating layer is made of a photosensitive insulating resin, and exposure and development are performed in the photosensitive insulating resin to form a cavity for device mounting, it is possible to solve various reliability problems that occur in the process of forming the cavity, and the device can be mounted in the cavity, so that the overall thickness of the package substrate can be reduced by the depth of the cavity.

Circuit patterns 431, 432, 433, 434, 435, 436, 437, 438, and 439 are disposed on the surfaces of the plurality of insulating layers in the embodiment.

Preferably, a first circuit pattern 431 is disposed on a upper surface of the first insulating layer 411. In addition, a second circuit pattern 432 is disposed under a lower surface of the first insulating layer 411.

In addition, a third circuit pattern 433 is disposed on an upper surface of the second insulating layer 412. A fourth circuit pattern 434 is disposed under a lower surface of the third insulating layer 413. A fifth circuit pattern 434 is disposed on an upper surface of the fourth insulating layer 414. A sixth circuit pattern 436 is disposed under a lower surface of the fifth insulating layer 415. A seventh circuit pattern 437 is disposed on an upper surface of the sixth insulating layer 416. An eighth circuit pattern 438 is disposed on an upper surface of the seventh insulating layer 421. A ninth circuit pattern 439 is disposed under a lower surface of the eighth insulating layer 422.

As described above, the circuit patterns 431, 432, 433, 434, 435, 436, 437, 438, and 439 disposed on the surface of each insulating layer may be formed of a metal material having high electrical conductivity. To this end, the circuit patterns 431, 432, 433, 434, 435, 436, 437, 438, and 439 may be formed of at least one metal material selected from gold (Au), silver (Ag), platinum (Pt), titanium (Ti), tin (Sn), copper (Cu), and zinc (Zn). In addition, the circuit patterns 431, 432, 433, 434, 435, 436, 437, 438, and 439 may be formed of a paste or solder paste including at least one metal material selected from gold (Au), silver (Ag), platinum (Pt), titanium (Ti), tin (Sn), copper (Cu), and zinc (Zn) having excellent bonding strength. Preferably, the circuit patterns 431, 432, 433, 434, 435, 436, 437, 438, and 439 may be formed of copper (Cu), which has high electrical conductivity and is relatively inexpensive.

The circuit patterns 431, 432, 433, 434, 435, 436, 437, 438, and 439 may be formed by an additive process, a subtractive process, a modified semi additive process (MSAP) and a semi additive process (SAP) method, which is a typical printed circuit board manufacturing process, and a detailed description thereof will be omitted herein.

Meanwhile, vias 441, 442, 443, 444, 445, 446, 446, 448, and 449 for electrically connecting circuit patterns disposed on different layers may be disposed in each insulating layer. Vias 441, 442, 443, 444, 445, 446, 446, 448, and 449 may be disposed through each insulating layer, thereby, circuit patterns disposed on the surfaces of different insulating layers may be electrically connected to each other.

To this end, the vias 441, 442, 443, 444, 445, 446, 446, 448, and 449 may include first to ninth vias.

The first via 441 may be disposed to pass through the first insulating layer 411. The first via 441 may electrically connect the first circuit pattern 431 disposed on the upper surface of the first insulating layer 411 and the second circuit pattern 432 disposed under the lower surface of the first insulating layer 411.

The second via 442 may be disposed to pass through the second insulating layer 412. The second via 442 may electrically connect the third circuit pattern 433 disposed on the upper surface of the second insulating layer 412 and the first circuit pattern 431.

The third via 443 may be disposed to pass through the third insulating layer 413. The third via 443 may electrically connect the second circuit pattern 432 disposed under the lower surface of the first insulating layer 411 and the fourth circuit pattern 434 disposed under the lower surface of the third insulating layer 413.

The fourth via 444 may be disposed to pass through the fourth insulating layer 414. The fourth via 444 may electrically connect the third circuit pattern 433 disposed on the upper surface of the second insulating layer 412 and the fifth circuit pattern 435 disposed on the upper surface of the fourth insulating layer 414.

The fifth via 445 may be disposed to pass through the third insulating layer 415. The fifth via 445 may electrically connect the fourth circuit pattern 434 disposed under the lower surface of the third insulating layer 413 and the sixth circuit pattern 436 disposed under the lower surface of the fifth insulating layer 415.

The sixth via 446 may be disposed to pass through the sixth insulating layer 416. The sixth via 446 may electrically connects the fifth circuit pattern 435 disposed on the upper surface of the fourth insulating layer 414 and the seventh circuit pattern 437 disposed on the upper surface of the sixth insulating layer 416.

The seventh via 447 may be disposed to pass through the seventh insulating layer 421. The seventh via 447 may electrically connect the seventh circuit pattern 437 disposed on the upper surface of the sixth insulating layer 416 and the eighth circuit pattern 438 disposed on the upper surface of the seventh insulating layer 421.

The eighth via 448 may be disposed to pass through the eighth insulating layer 422. The eighth via 448 may electrically connect the sixth circuit pattern 436 disposed under the lower surface of the fifth insulating layer 415 and the ninth circuit pattern 439 disposed under the lower surface of the eighth insulating layer 422.

At this time, as described above, the first insulating layer 411, the second insulating layer 412, the third insulating layer 413, the fourth insulating layer 414, the fifth insulating layer 415, and the sixth insulating layer 416 may be formed of a prepreg.

Accordingly, the first to sixth vias 441, 442, 443, 444, 445, and 446 may have a third width W3.

The first to sixth vias 441, 442, 443, 444, 445, 446 are passages for the interlayer electrical connection of the printed circuit board, may be formed by drilling an electrically disconnected layer to form a via hole, and filling the formed via hole with a conductive material or plating with a conductive material.

A metal material for forming the first to sixth vias 441, 442, 443, 444, 445, 446 may be any one material selected from Cu, Ag, Sn, Au, Ni, and Pd, and the metal material may be filled using any one of electroless plating, electrolytic plating, screen printing, sputtering, evaporation, ink jetting and dispensing or combination thereof.

In this case, the via hole may be formed by any one of processing methods, including mechanical, laser, and chemical processing.

When the via hole is formed by mechanical processing, methods such as milling, drilling, and routing may be used, and when the via hole is formed by laser processing, a UV or $CO_2$ laser method may be used, and when the via hole is formed by chemical processing, drugs containing aminosilane, ketones, etc. may be used, and the like, thereby the first to sixth insulating layers 411, 412, 413, 414, 415, 416 may be opened.

On the other hand, the processing by the laser is a cutting method that takes the desired shape to melt and evaporate a part of the material by concentrating optical energy on the surface, it can easily process complex formations by computer programs, and can process composite materials that are difficult to cut by other methods.

As the laser processing drill, it is preferable to use a YAG (Yttrium Aluminum Garnet) laser, a $CO_2$ laser, or an ultraviolet (UV) laser. The YAG laser is a laser that can process both the copper foil layer and the insulating layer, and the $CO_2$ laser is a laser that can process only the insulating layer.

At this time, as described above, the first to sixth vias 441, 442, 443, 444, 445, 446 are formed by filling the inside of the via hole formed by laser processing with a metal material, accordingly, there is a limit to the minimum width that can be formed through the laser processing. Accordingly, the first to sixth vias 441, 442, 443, 444, 445, and 446 may have a width of 50 μm to 400 μm. For example, the first to sixth vias 441, 442, 443, 444, 445, and 446 may have a width in a range of 70 μm to 500 μm.

Meanwhile, the seventh and eighth vias 447 and 448 are disposed in the seventh insulating layer 421 and the eighth insulating layer 422 made of a photosensitive insulating resin. Accordingly, the seventh insulating layer 421 and the eighth insulating layer 422 form a via hole by opening the photosensitive insulating resin through exposure and development, and it may be formed by filling the inside of the formed via hole with a metal material. Accordingly, the seventh and eighth vias 447 and 448 may have a second width W2. Preferably, the seventh and eighth vias 447 and 448 may have a second width W2 smaller than the third width W3. Preferably, the via holes formed in the first to sixth insulating layers may be larger than the via holes formed in the seventh and eighth insulating layers. Preferably, the seventh and eighth vias 447 and 448 may have a width satisfying a range of 15 μm to 50 μm. For example, the seventh and eighth vias 447 and 448 may have a width satisfying a range of 20 μm to 35 μm.

Also, the eighth circuit pattern 438 disposed on the upper surface of the seventh insulating layer 421 and the ninth circuit pattern 439 disposed under the lower surface of the eighth insulating layer 422 may have a first line width.

And, the first to seventh circuit patterns 431, 432, 433, 434, 435, 436, 437 disposed on the surfaces of the first to sixth insulating layers 411, 412, 413, 414, 415, 416 may have a second line width greater than the first line width.

That is, circuit patterns formed on the surfaces of the seventh and eighth insulating layers 421 and 422 made of the photosensitive insulating resin may be finer than the circuit patterns formed on the surfaces of the first to sixth insulating layers 411, 412, 413, 414, 415, 416.

Meanwhile, a first opening OR1 and a second opening OR2 may be formed in the seventh insulating layer 421 and the eighth insulating layer 422.

In addition, the first opening OR1 and the second opening OR2 may be simultaneously formed with the via hole formed in the seventh insulating layer 421 and the eighth insulating layer 422 to form the seventh and eighth vias 447 and 448.

A region opened through the first opening OR1 and the second opening OR2 may have a range of 500 μm to 8000 μm. That is, the first opening OR1 and the second opening OR2 may have a width smaller than a width of a cavity that may be formed by the laser in the comparative example.

Meanwhile, a protective layer 450 may be disposed on the upper surface of the seventh insulating layer 421 and/or the lower surface of the eighth insulating layer 422. The protective layer 450 may protect the surface of the seventh insulating layer 421 and/or the surface of the eighth insulating layer 422 or the surface of the eighth circuit pattern 438 and/or the surface of the ninth circuit pattern 439.

At this time, although it is illustrated that the protective layer 450 is disposed only under the lower surface of the eighth insulating layer 422 in the figure, the embodiment is not limited thereto. The protective layer 450 may also be disposed on the upper surface of the seventh insulating layer 421, and alternatively, the protective layer 450 may be omitted without being disposed on the eighth insulating layer 422.

The protective layer 450 may include various materials that can be cured by heating after being applied to protect the surface of the circuit pattern. The protective layer 450 may be a resist layer. For example, the protective layer 450 may be a solder resist layer including an organic polymer material. For example, the protective layer 450 may include an epoxy acrylate-based resin. In detail, protective layer 450 may include a resin, a curing agent, a photoinitiator, a pigment, a solvent, a filler, an additive, an acryl-based monomer, and the like. However, the embodiment is not limited thereto, and the protective layer 450 may be any one of a photo-solder resist layer, a coverlay, and a polymer material.

The protective layer 450 may have a thickness of 1 μm to 20 μm. The protective layer 450 may have a thickness of 1 μm to 15 μm. For example, the thickness of the protective layer 450 may be 5 μm to 20 μm. When the thickness of the protective layer 450 is greater than 20 μm, the thickness of the printed circuit board may increase. When the thickness of the protective layer 450 is less than 1 μm, the reliability of the circuit pattern may be deteriorated.

According to an embodiment, an outermost insulating layer of the printed circuit board is formed of a photoimageable dielectric (PID). Then, a cavity in which the device can be mounted is formed in the outermost insulating layer, and the device can be mounted in the formed cavity. Accordingly, as at least a part of the device is disposed in the outermost insulating layer of the printed circuit board, it is possible to reduce the overall thickness of the package substrate by the depth of the cavity. In addition, according to an embodiment, as the insulating layer in which the cavity is formed is composed of photoimageable dielectics (PID), and it is possible to easily form a cavity for device mounting through exposure and development, accordingly, it is possible to solve a reliability problem that may occur when the cavity is formed.

Figure 25:
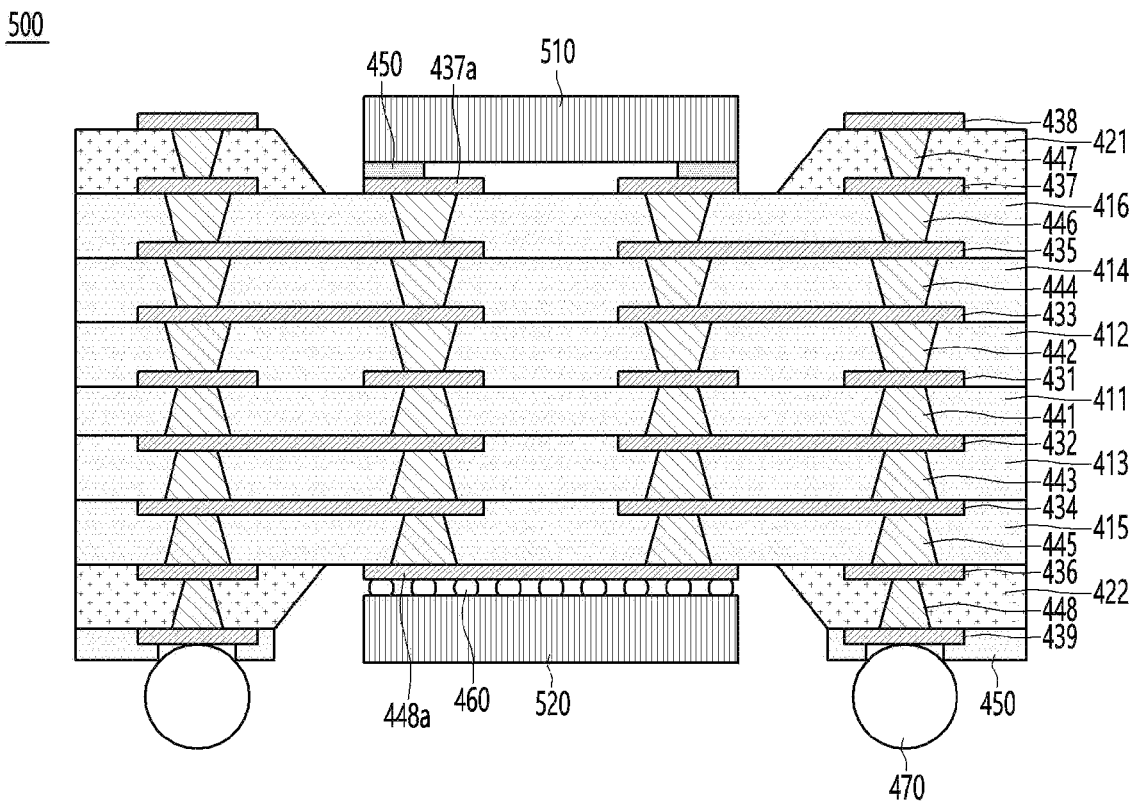
FIG. 25 is a view showing a package substrate according to an exemplary embodiment.

FIG. 25 is a view showing a package substrate according to an exemplary embodiment.

Referring to FIG. 25, the package substrate 500 has a structure in which a first device 510 and a second device 520 in the first opening OR1 and the second opening OR2 included in the printed circuit board 500 of FIG. 24.

That is, a first lead part 437a is exposed on the sixth insulating layer 416 through the first opening OR1.

Also, a second lead part 436a is exposed on the fifth insulating layer 415 through the second opening OR2.

In addition, a first connection portion 450 may be disposed on the exposed first lead part 437a.

In addition, a second connection portion 460 may be disposed on the exposed second lead part 436a.

The first connection portion 450 and the second connection portion 460 may have different shapes. For example, the first connection portion 450 may have a hexahedral shape. In detail, a cross-section of the first connection portion 450 may include a rectangular shape. In more detail, the cross-section of the first connection portion 450 may include a rectangular or square shape. For example, the second connection portion 460 may have a spherical shape. A cross-section of the second connection portion 460 may have a circular shape. Alternatively, the second connection portion 460 may have a partially or entirely rounded shape. For example, the cross-sectional shape of the second connection portion 460 may include a planar surface on one side and a curved surface on the other side opposite to the one side.

The first connection portion 450 and the second connection portion 460 may have different sizes. The first connection portion 450 may be smaller than the second connection portion 460.

The first connection portion 450 and the second connection portion 460 may have different widths.

For example, a width between both side surfaces of one first connection portion 450 may be smaller than a width between both side surfaces of one second connection portion 460.

The first device 510 may be disposed on the first connection portion 450. The first connection portion 450 may include a conductive material. Accordingly, the first connection portion 450 may electrically connect the first device 510 disposed on the upper surface of the first connection portion 450 and the first lead part 437a.

The second device 520 may be disposed on the second connection portion 460. The second connection portion 460 may include a conductive material. Accordingly, the second connection portion 460 may electrically connect the second device 520 disposed on the upper surface of the second connection portion 460 and the second lead part 436a disposed on the lower surface of the second connection portion 460.

In this case, the first device 510 and the second device 520 may be electronic components such as chips, which may be divided into active devices and passive devices. In addition, the active device is a device that actively uses a non-linear portion, and the passive device refers to a device that does not use the non-linear characteristic even though both linear and non-linear characteristics exist. In addition, the passive device may include a transistor, an IC semiconductor chip, and the like, and the passive device may include a capacitor, a resistor, an inductor, and the like. The passive device is mounted on a general printed circuit board to increase a signal processing speed of a semiconductor chip, which is an active device, or to perform a filtering function.

For example, the first device 510 may be an inductor or a low noise amplifier (LNA) for filtering. For example, the second device 520 may be a power amplifier (PA).

As described above, in the embodiment, at least a part of the first device 510 and the second device 520 is disposed in the first opening OR1 and the second opening OR2 of the seventh insulating layer 421 and the eighth insulating layer 422 formed of the photosensitive insulating resin and, accordingly, the overall thickness of the package substrate may be reduced.

Meanwhile, an outer lead (not shown) that is a part of the ninth circuit pattern may be exposed under the lower surface of the eighth insulating layer 422 through the opening of the protective layer 450. In addition, a third connection portion 470 may be disposed on the outer lead. The third connection portion 470 may be, for example, a solder ball, but is not limited thereto. The third connection portion 470 may electrically connect the package substrate 500 and another external substrate.

Hereinafter, the manufacturing process of the printed circuit board shown in FIG. 24 will be described in detail.

FIGS. 26 to 30 are views for explaining the printed circuit board shown in FIG. 24 in the order of manufacturing processes.

Figure 26:
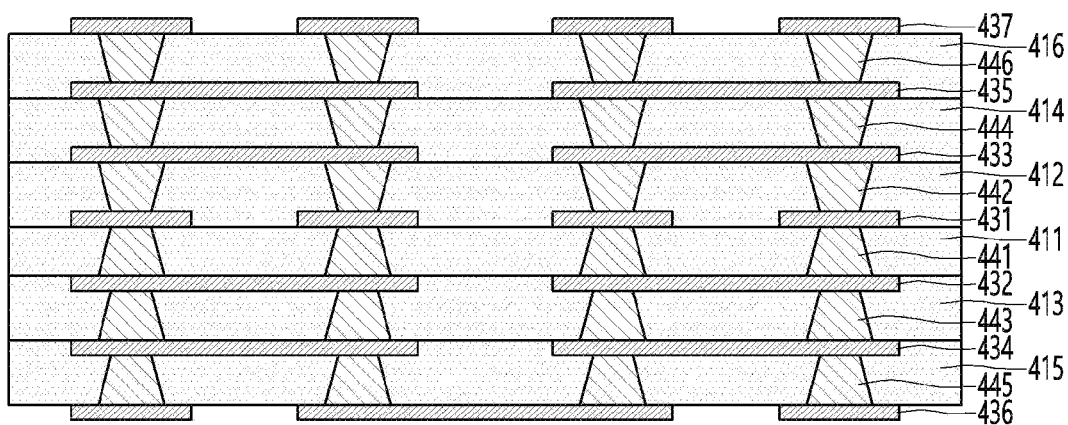
FIGS. 26 to 30 are views for explaining the printed circuit board shown in FIG. 24 in the order of manufacturing processes.

First, referring to FIG. 26, an inner layer of a printed circuit board is formed. Here, the inner layer means a substrate in a state before the seventh insulating layer 421 and the eighth insulating layer 422 constituting the outermost layer of the printed circuit board 400 are stacked.

To this end, first the first insulating layer 411 may be prepared, and the first circuit pattern 431 and the second circuit pattern 432 may be formed on the surface of the first insulating layer 411.

In addition, the first via 441 passing through the first insulating layer 411 and electrically connecting the first circuit pattern 431 and the second circuit pattern 432 may be formed in the first insulating layer 411.

Thereafter, the second insulating layer 412 may be formed on the first insulating layer 411. In addition, the third circuit pattern 433 may be formed on the second insulating layer 412. In addition, the second via 442 passing through the second insulating layer 412 and electrically connecting the third circuit pattern 433 and the first circuit pattern 431 may be formed.

Thereafter, the fourth insulating layer 414 may be formed on the second insulating layer 412, and the third insulating layer 413 may be formed under the first insulating layer 411. After the fourth insulating layer 414 and the third insulating layer 413 are formed, a process of forming the fifth circuit pattern 435, the fourth circuit pattern 434, the fourth via 444 and the third via 443 may be performed as before.

Thereafter, the sixth insulating layer 416 may be formed on the fourth insulating layer 414, and the fifth insulating layer 415 may be formed under the third insulating layer 413. After the sixth insulating layer 416 and the fifth insulating layer 415 are formed, a process of forming the seventh circuit pattern 437, the sixth circuit pattern 436, the sixth via 446 and the fifth 445 may be performed as before.

Figure 27:
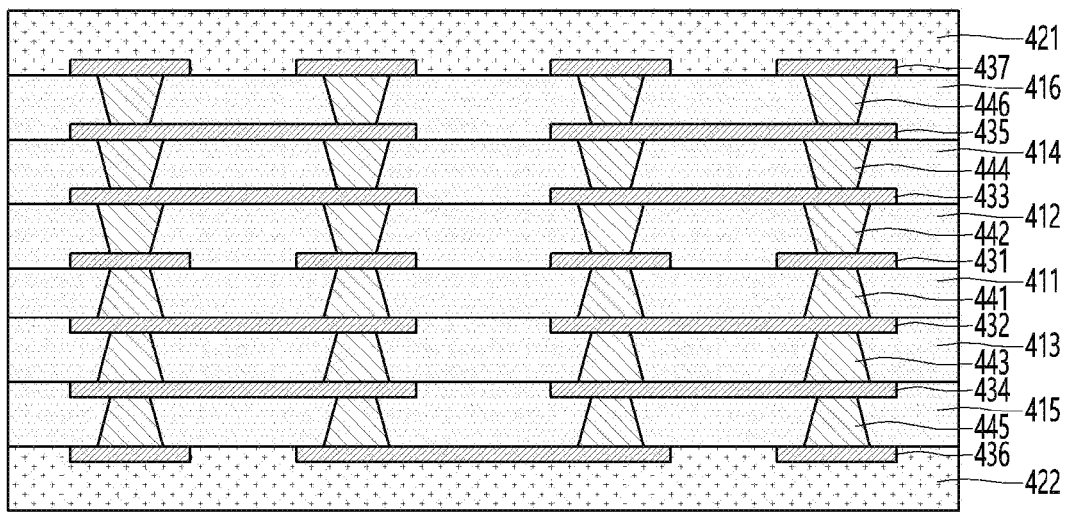

Thereafter, as shown in FIG. 27, the seventh insulating layer 421 and the eighth insulating layer 422 are formed on the sixth insulating layer 416 and under the fifth insulating layer 415, respectively.

The seventh insulating layer 421 may be an insulating layer disposed at the uppermost of the plurality of insulating layers constituting the printed circuit board 400.

The eighth insulating layer 422 may be an insulating layer disposed at the lowermost of the plurality of insulating layers constituting the printed circuit board 400.

In this case, the seventh insulating layer 421 and the eighth insulating layer 422 may include a photosensitive insulating resin.

When the seventh insulating layer 421 and the eighth insulating layer 422 include a photosensitive insulating resin, a protective layer such as a solder resist generally disposed on the outermost side of the printed circuit board may be selectively removed.

In this case, the seventh insulating layer 421 and the eighth insulating layer 422 may be attached to the fifth insulating layer 415 and the sixth insulating layer 416 in the form of a film.

Figure 28:
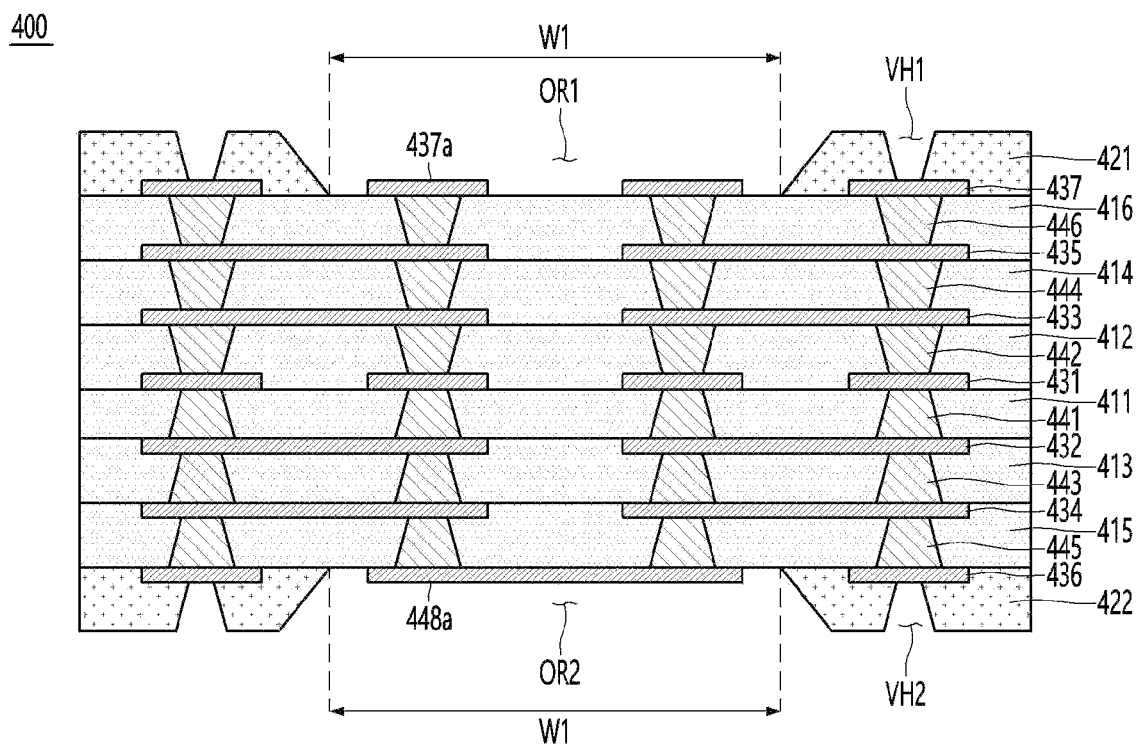

Thereafter, referring to FIG. 28, via holes, the first opening OR1, and the second opening OR2 may be formed in the seventh insulating layer 421 and the eighth insulating layer 422 through exposure and development processes.

Accordingly, the seventh insulating layer 421 and the eighth insulating layer 422 include the first opening OR1 and the second opening OR2, respectively.

The seventh insulating layer 421 includes a first opening OR1. The first opening OR1 may be formed by opening the seventh insulating layer 421 in a region where a first device (to be described later) is disposed. Preferably, the first opening OR1 may expose a first lead part 437*a* disposed in a region where a first device is to be mounted among the circuit patterns 437 disposed on the sixth insulating layer 416.

The eighth insulating layer 422 includes a second opening OR2. The second opening OR2 may be formed by opening the eighth insulating layer 422 in a region where a second device (to be described later) is disposed. Preferably, the second opening OR2 may expose a second lead part 436*a* disposed in a region where a second device is to be mounted among the circuit patterns 436 disposed under the fifth insulating layer 415.

In this case, the first opening OR1 and the second opening OR2 may be formed by exposing and developing the seventh insulating layer 421 and the eighth insulating layer 422. That is, in the comparative example, when the cavity was formed on the insulating layer, a laser drilling process was generally performed. Accordingly, in the comparative example, damage to the insulating layer or the circuit pattern layer may occur by the laser drilling, and it was difficult to set an accurate position.

On the contrary, in the embodiment, the seventh insulating layer 421 and the eighth insulating layer 422 disposed at the outermost side are made of a photosensitive insulating resin. Based on this, the first opening OR1 and the second opening OR2 may be formed in the seventh insulating layer 421 and the eighth insulating layer 422 by exposure and development processes. In addition, the first opening OR1 and the second opening OR2 may be cavities for mounting the first and second devices on the first and second lead parts 437*a* and 436*a* later.

As described above, in the embodiment, the outermost insulating layer is made of a photosensitive insulating resin, and exposure and development are performed in the photosensitive insulating resin to form a cavity for device mounting, it is possible to solve various reliability problems that occur in the process of forming the cavity, and the device can be mounted in the cavity, so that the overall thickness of the package substrate can be reduced by the depth of the cavity.

Figure 29:
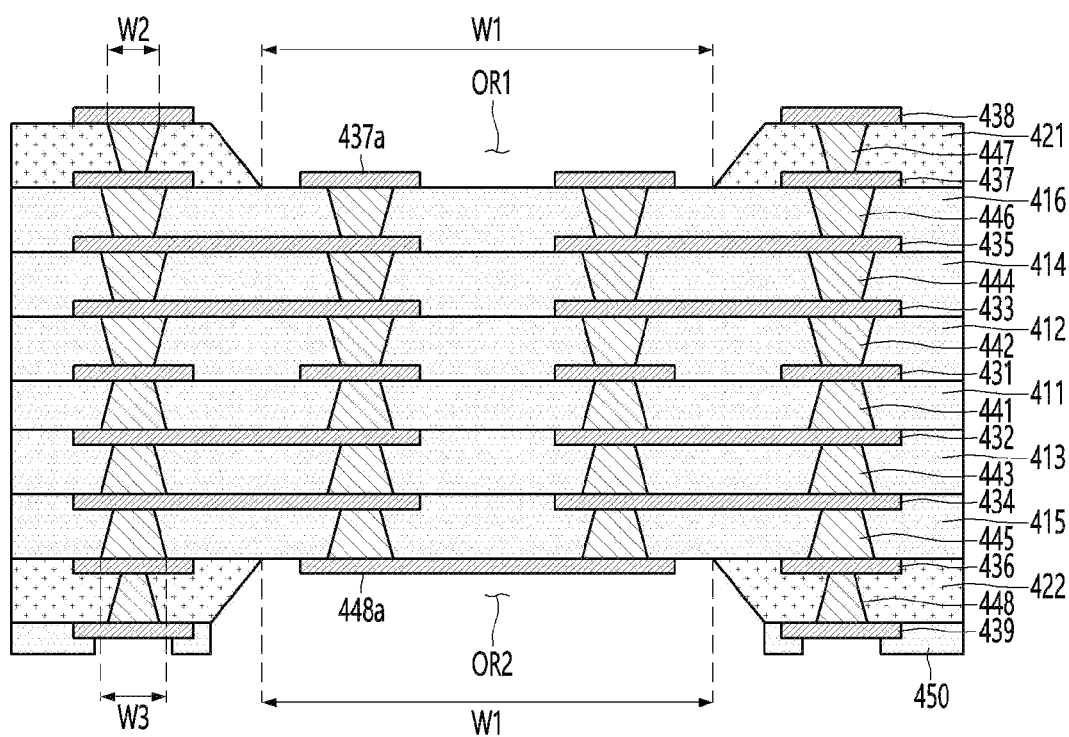

Next, as shown in FIG. 29, the seventh via 447 and the eighth via 448 filling the inside of the via hole are formed, and surfaces of the seventh insulating layer 421 and the eighth insulating layer 422 are formed, and the eighth circuit pattern 438 and the ninth circuit pattern 439 are formed on the seventh insulating layer 421 and the eighth insulating layer 422, respectively.

At this time, as described above, the first to sixth vias 441, 442, 443, 444, 445, 446 are formed by filling the inside of the via hole formed by laser processing with a metal material, accordingly, there is a limit to the minimum width that can be formed through the laser processing. Accordingly, the first to sixth vias 441, 442, 443, 444, 445, and 446 may have a width of 50 μm to 400 μm. For example, the first to sixth vias 441, 442, 443, 444, 445, and 446 may have a width in a range of 70 μm to 500 μm.

Meanwhile, the seventh and eighth vias 447 and 448 are disposed in the seventh insulating layer 421 and the eighth insulating layer 422 made of a photosensitive insulating resin. Accordingly, the seventh insulating layer 421 and the eighth insulating layer 422 form a via hole by opening the photosensitive insulating resin through exposure and development, and it may be formed by filling the inside of the formed via hole with a metal material. Accordingly, the seventh and eighth vias 447 and 448 may have a second width W2. Preferably, the seventh and eighth vias 447 and 448 may have a second width W2 smaller than the third width W3. Preferably, the via holes formed in the first to sixth insulating layers may be larger than the via holes formed in the seventh and eighth insulating layers. Preferably, the seventh and eighth vias 447 and 448 may have a width satisfying a range of 15 μm to 50 μm. For example, the seventh and eighth vias 447 and 448 may have a width satisfying a range of 20 μm to 35 μm.

Also, the eighth circuit pattern 438 disposed on the upper surface of the seventh insulating layer 421 and the ninth circuit pattern 439 disposed under the lower surface of the eighth insulating layer 422 may have a first line width.

And, the first to seventh circuit patterns 431, 432, 433, 434, 435, 436, 437 disposed on the surfaces of the first to sixth insulating layers 411, 412, 413, 414, 415, 416 may have a second line width greater than the first line width.

That is, circuit patterns formed on the surfaces of the seventh and eighth insulating layers 421 and 422 made of the photosensitive insulating resin may be finer than the circuit patterns formed on the surfaces of the first to sixth insulating layers 411, 412, 413, 414, 415, 416.

A region opened through the first opening OR1 and the second opening OR2 may have a range of 500 μm to 8000 μm. That is, the first opening OR1 and the second opening OR2 may have a width smaller than a width of a cavity that may be formed by the laser in the comparative example.

Meanwhile, a protective layer 450 may be disposed on the upper surface of the seventh insulating layer 421 and/or the lower surface of the eighth insulating layer 422. The protective layer 450 may protect the surface of the seventh insulating layer 421 and/or the surface of the eighth insulating layer 422 or the surface of the eighth circuit pattern 438 and/or the surface of the ninth circuit pattern 439.

At this time, although it is illustrated that the protective layer 450 is disposed only under the lower surface of the eighth insulating layer 422 in the figure, the embodiment is not limited thereto. The protective layer 450 may also be disposed on the upper surface of the seventh insulating layer 421, and alternatively, the protective layer 450 may be omitted without being disposed on the eighth insulating layer 422.

The protective layer 450 may include various materials that can be cured by heating after being applied to protect the surface of the circuit pattern. The protective layer 450 may be a resist layer. For example, the protective layer 450 may be a solder resist layer including an organic polymer material. For example, the protective layer 450 may include an epoxy acrylate-based resin. In detail, protective layer 450 may include a resin, a curing agent, a photoinitiator, a pigment, a solvent, a filler, an additive, an acryl-based monomer, and the like. However, the embodiment is not limited thereto, and the protective layer 450 may be any one of a photo-solder resist layer, a coverlay, and a polymer material.

The protective layer 450 may have a thickness of 1 μm to 20 μm. The protective layer 450 may have a thickness of 1 μm to 15 μm. For example, the thickness of the protective layer 450 may be 5 μm to 20 μm. When the thickness of the protective layer 450 is greater than 20 μm, the thickness of the printed circuit board may increase. When the thickness of the protective layer 450 is less than 1 μm, the reliability of the circuit pattern may be deteriorated.

Figure 30:
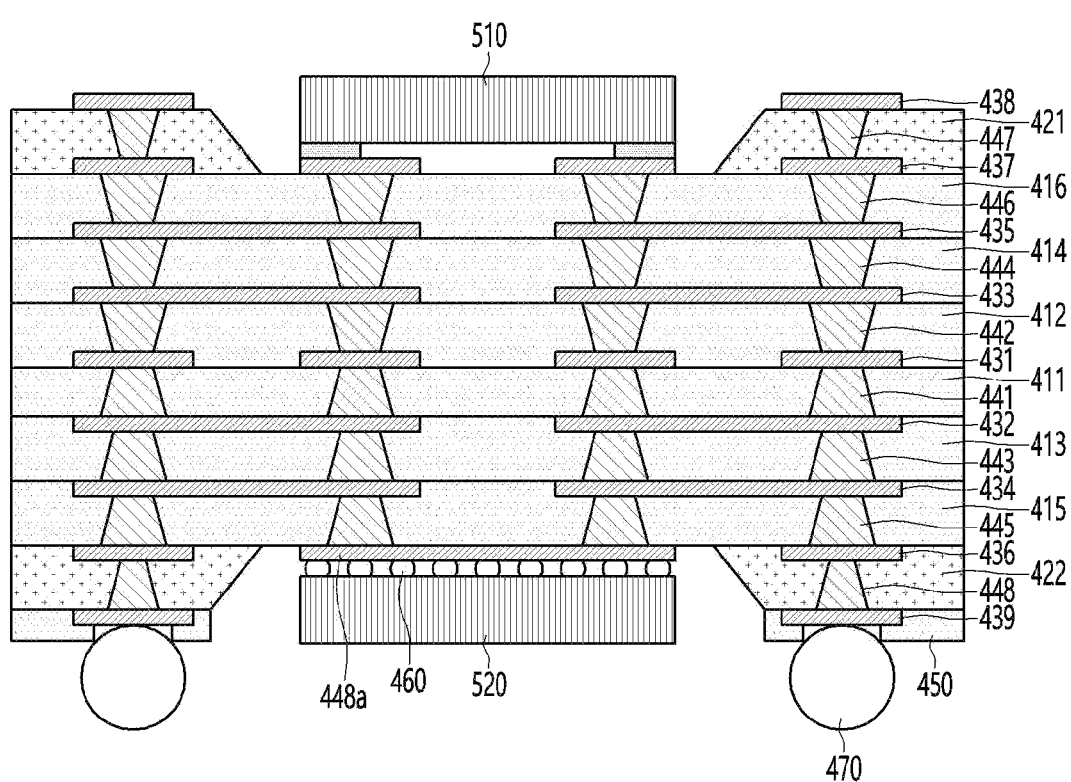

Next, as shown in FIG. 30, the first connection portion 450 and the second connection portion 460 may be formed on the first lead part 437a and the second lead part 436a, respectively.

In addition, the first device 510 may be mounted on the first lead part 437a using the first connection portion 450.

Also, the second device 510 may be mounted on the second lead part 436a using the second connection portion 460.

Meanwhile, the outer lead may be exposed through the protective layer 450, and the third connection portion 470 may be disposed on the outer lead.

Figure 31:
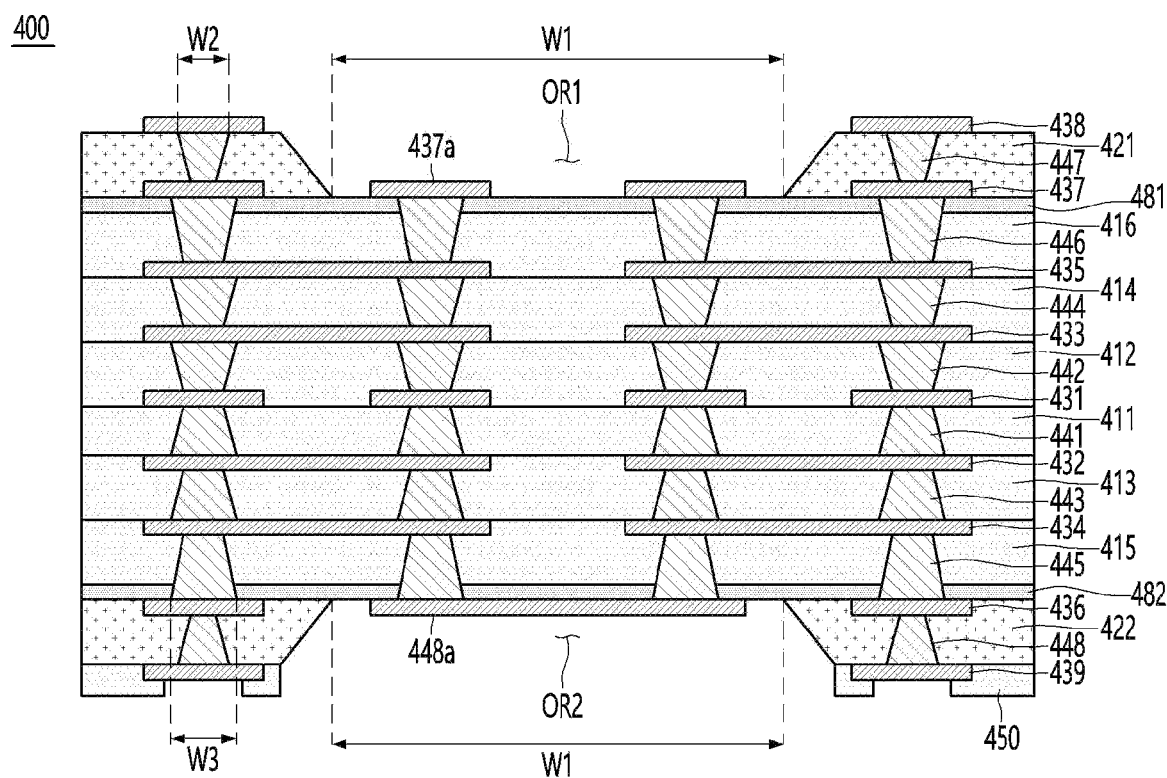
FIG. 31 is a view showing a printed circuit board according to a fifth embodiment.

FIG. 31 is a view showing a printed circuit board according to a fifth embodiment.

Before describing of FIG. 31, the same reference numerals as those of FIG. 24 indicate the same components, and descriptions overlapping those of the fourth embodiment described above are excluded.

In the printed circuit board shown in FIG. 31, adhesive insulating layers 481 and 482 may be additionally disposed compared to the printed circuit board shown in FIG. 24.

Preferably, a first adhesive insulating layer 481 may be disposed between the sixth insulating layer 416 and the seventh insulating layer 421.

Also, a second adhesive insulating layer 482 may be disposed between the fifth insulating layer 415 and the eighth insulating layer 422.

Preferably, the first adhesive insulating layer 481 and the second adhesive insulating layer 482 are disposed between the prepreg and the photosensitive insulating resin, and it is possible to solve the problem of adhesion caused by the difference in physical properties between the photosensitive insulating resin and the prepreg.

To this end, the first adhesive insulating layer 481 and the second adhesive insulating layer 482 may be made of a thermosetting resin, thereby increasing the adhesive force between the prepreg and the photosensitive insulating resin.

At this time, if the thermosetting resin constituting the first adhesive insulating layer 481 and the second adhesive insulating layer 482 is a resin that is cured by heat, known materials can be used without limitation, for example, urea resin, melamine resin, bismaleimide resin, polyurethane resin, resin having a benzoxazine ring, cyanate ester resin, bisphenol S-type epoxy resin, bisphenol F-type epoxy resin, and a copolymerized epoxy resin of bisphenol S and bisphenol F may be used.

Accordingly, in FIG. 24, the sixth via 446 is disposed to pass only the sixth insulating layer 416, but according to FIG. 31, the sixth via 446 is disposed to pass through the sixth insulating layer 416 and the first adhesive layer.

Further, in FIG. 24, the fifth via 445 is disposed to pass only the fifth insulating layer 415, but according to FIG. 31, the fifth via 445 is disposed to pass the fifth insulating layer 415 and the second adhesive insulating layer 482.

In other words, each of the fifth insulating layer 415 and the sixth insulating layer 416 in FIG. 31 does not have a one-layer structure, but may have a two-layer structure including the first adhesive insulating layer 481 and the second adhesive insulating layer 482, respectively.

In addition, according to an embodiment of the present invention, an additional insulating layer of a different material is disposed between the outermost insulating layer and the inner insulating layer. In this case, the additional insulating layer may be composed of a thermosetting insulating resin. Here, when the prepreg (PPG) constituting the inner insulating layer and the photosensitive insulating resin (PID) constituting the outermost insulating layer are in direct contact with each other, adhesion to each other may be lowered due to a difference in physical properties between the prepreg and the photosensitive insulating resin. Accordingly, in the embodiment, by additionally disposing a thermosetting insulating resin between the photosensitive insulating resin and the prepreg, the adhesion between the photosensitive insulating resin and the prepreg may be increased, and thus product reliability may be improved.

Meanwhile, although not shown in the drawings, the adhesive insulating layer shown in FIG. 30 and the first and second pads may be simultaneously formed in order to improve reliability while maximizing adhesive force. In this case, the first pad may be disposed on the first adhesive insulating layer, and the second pad may be disposed on the second adhesive insulating layer.

Figure 32:
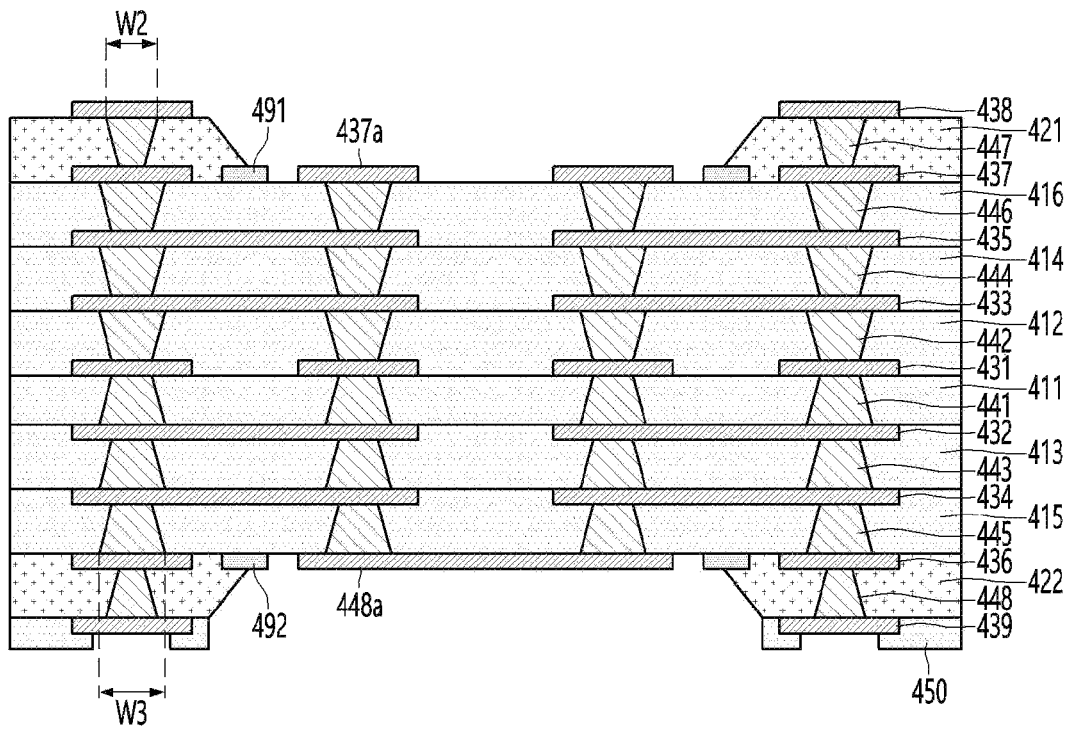
FIG. 32 is a view showing a printed circuit board according to a sixth embodiment.

FIG. 32 is a view showing a printed circuit board according to a sixth embodiment.

Before describing of FIG. 32, the same reference numerals as those of FIG. 24 indicate the same components, and descriptions overlapping those of the fourth embodiment described above are excluded.

Referring to FIG. 32, on the upper surface of the sixth insulating layer 416, a first pad 491 is disposed in a region where the first opening OR1 is to be formed. That is, the first pad 491 may be formed in an outer region of the first opening OR1. Preferably, the first pad 491 may be disposed to surround a region where the first opening OR1 is to be formed. In other words, the first pad 491 may be disposed on a boundary region of a cavity in which the first device 510 is to be mounted. For example, the first pad 491 may be disposed on a boundary area between a region in which the first opening OR1 is to be formed and a region other than the first pad 491.

Accordingly, the first pad 491 may be disposed in an outer region of the first lead part 437a exposed by the first opening OR1. For example, the first pad 491 may be disposed to surround the periphery of the first lead part 437a exposed by the first opening OR1.

Also, under the lower surface of the fifth insulating layer 415, a second pad 492 is disposed in a region where the second opening OR2 is to be formed. That is, the second pad 492 may be formed in an outer region of the second opening OR2. Preferably, the second pad 492 may be disposed to surround the region where the second opening OR2 is to be formed. In other words, the second pad 492 may be disposed on a boundary region of a cavity in which the second device 520 is mounted. Here, the boundary region of the cavity may be a region in which the inner wall of the cavity is located.

For example, the second pad 492 may be disposed on a boundary region between the region in which the second opening OR2 is to be formed and the other regions.

Accordingly, the second pad 492 may be disposed in an outer region of the second lead part 436a exposed by the second opening OR2. For example, the second pad 492 may be disposed to surround the second lead part 436a exposed by the second opening OR2.

The first pad 491 and the second pad 492 may be formed of a metal material. Preferably, the first pad 491 and the second pad 492 may be formed of the same metal material as the circuit patterns. More preferably, the first pad 491 and the second pad 492 may be formed together with the seventh circuit pattern 437. Accordingly, the first pad 491 and the second pad 492 may be formed of a metal material having high electrical conductivity. To this end, the first pad 491 and the second pad 492 may be formed of at least one metal material selected from among gold (Au), silver (Ag), platinum (Pt), titanium (Ti), tin (Sn), copper (Cu), and zinc (Zn). Preferably, the first pad 491 and the second pad 492 may be formed of copper (Cu), which has high electrical conductivity and is relatively inexpensive.

Figure 33:
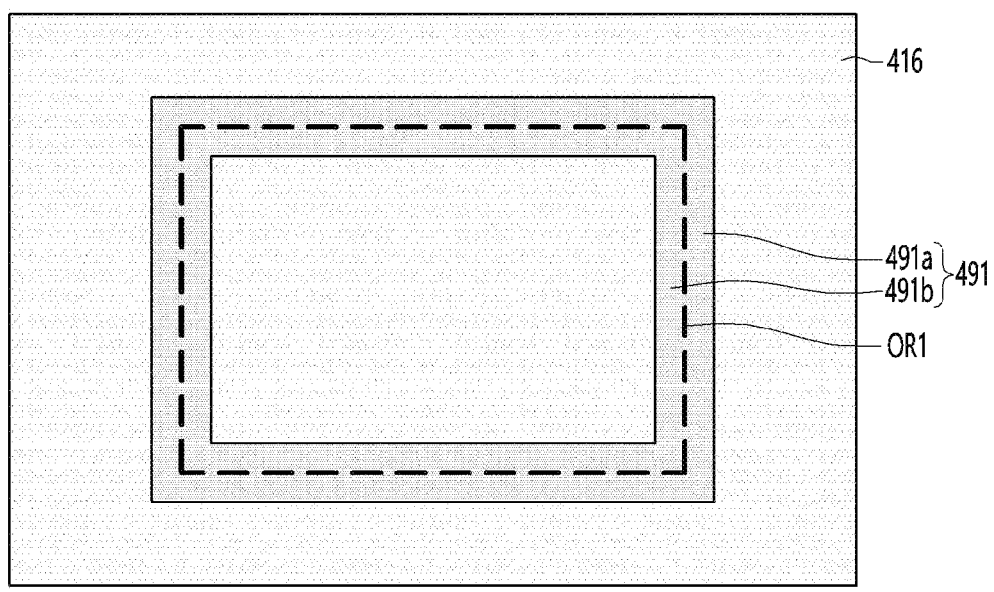
FIG. 33 is a plan view of a pad of FIG. 32.

FIG. 33 is a plan view of the pad of FIG. 32.

FIG. 33 shows an upper structure of the sixth insulating layer 416 in a state in which the seventh insulating layer 421 is removed in FIG. 32.

Referring to FIG. 33, a region in which the first opening OR1 is to be formed is present on the sixth insulating layer 416. The region in which the first opening OR1 is to be formed may mean a region that vertically overlaps with the first opening OR1 formed on the seventh insulating layer 421 among the upper surfaces of the sixth insulating layer 416.

In addition, the first pad 491 may be disposed on an upper surface of the sixth insulating layer 416 that vertically overlaps with the inner wall of the first opening OR1.

In addition, although not shown in FIG. 33, like the first pad 491, a second pad 492 may be disposed under the lower surface of the fifth insulating layer 415 that vertically overlaps with the inner wall of the second opening OR2.

In this case, at least a part of the first pad 491 may overlap the first opening OR1.

Accordingly, the first pad 491 may include a first portion 491a disposed on the upper surface of the sixth insulating layer 416 and covered by the seventh insulating layer 421. Also, the first pad 491 may include a second portion 491b exposed through the first opening OR1 of the seventh insulating layer 421. That is, the first portion 491a of the first pad 491 may be covered by the seventh insulating layer 421, and the remaining second portion 491b excluding the first portion 491a may be exposed through the first opening OR1.

Likewise, although not shown in the drawing, the second pad 492 may include a first portion disposed under the lower surface of the fifth insulating layer 415 and covered by the eighth insulating layer 422, and a second portion exposed through the second opening OR2 of the eighth insulating layer 422.

According to the embodiment of the present invention as described above, the pad is disposed on the cavity boundary region on the inner insulating layer. The pad may be disposed to surround a region where the cavity is to be formed. At this time, when the pad is not present, an undercut occurs in the lower region of the photosensitive insulating resin on the cavity boundary region, accordingly, a peeling problem between the inner insulating layer and the outermost insulating layer may occur. Accordingly, in the embodiment, by disposing the pad on the cavity boundary region, the undercut problem, which is weak in reliability, can be solved, and thus product reliability can be improved.

Meanwhile, as shown in FIG. 33, the first pad 491 and the second pad 492 may have a closed loop shape surrounding an open region opened by the first opening and the second opening. In this case, the first pad 491 and the second pad 492 may have a rectangular shape, but are not limited thereto.

Figure 34A:
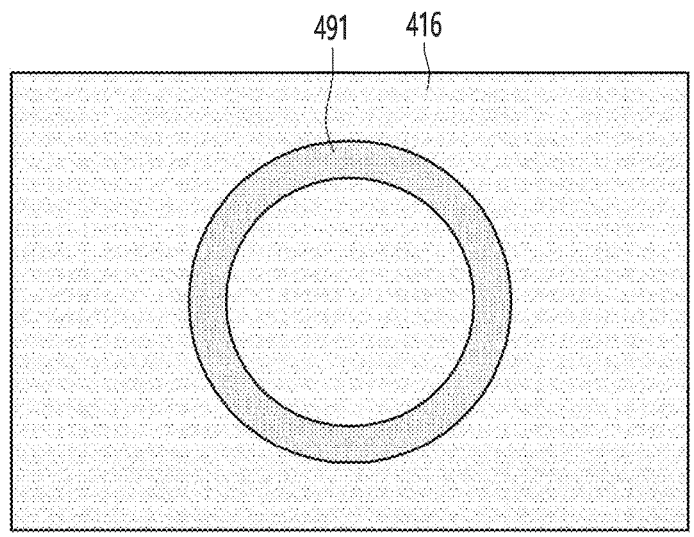
FIGS. 34A and 34B are views showing a modified example of the pad according to an embodiment.
Figure 34B:
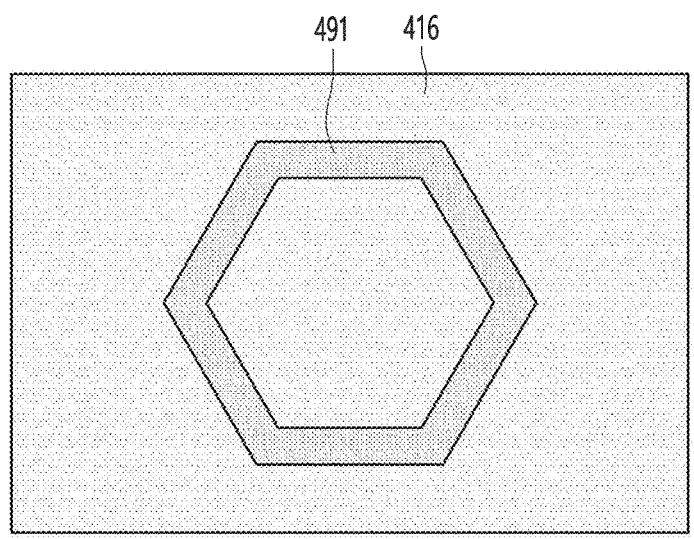

FIGS. 34A and 34B are views showing a modified example of the pad according to an embodiment.

As shown in FIG. 34A, the first pad 491 and the second pad 492 may have a circular shape instead of a square shape.

Also, as shown in FIG. 34B, the first pad 491 and the second pad 492 may have a polygonal shape, and an example thereof may have a hexagonal shape.

In addition to the shape shown in FIGS. 34A and 34B, the first pad 491 and the second pad 492 can be deformed into various shapes such as a triangular shape, a sector shape, and a trapezoid shape.

According to an embodiment, an outermost insulating layer of the printed circuit board is formed of a photoimageable dielectric (PID). Then, a cavity in which the device can be mounted is formed in the outermost insulating layer, and the device can be mounted in the formed cavity. Accordingly, as at least a part of the device is disposed in the outermost insulating layer of the printed circuit board, it is possible to reduce the overall thickness of the package substrate by the depth of the cavity. In addition, according to an embodiment, as the insulating layer in which the cavity is formed is composed of photoimageable dielectics (PID), and it is possible to easily form a cavity for device mounting through exposure and development, accordingly, it is possible to solve a reliability problem that may occur when the cavity is formed.

In addition, according to an embodiment of the present invention, an additional insulating layer of a different material is disposed between the outermost insulating layer and the inner insulating layer. In this case, the additional insulating layer may be composed of a thermosetting insulating resin. Here, when the prepreg (PPG) constituting the inner insulating layer and the photosensitive insulating resin (PID) constituting the outermost insulating layer are in direct contact with each other, adhesion to each other may be lowered due to a difference in physical properties between the prepreg and the photosensitive insulating resin. Accordingly, in the embodiment, by additionally disposing a thermosetting insulating resin between the photosensitive insulating resin and the prepreg, the adhesion between the photosensitive insulating resin and the prepreg may be increased, and thus product reliability may be improved.

Further, according to an embodiment of the present invention, a pad is disposed on the cavity boundary region on the inner insulating layer. The pad may be disposed to surround a region where the cavity is to be formed. At this time, when the pad is not present, an undercut occurs in the lower region of the photosensitive insulating resin on the cavity boundary region, accordingly, a peeling problem between the inner insulating layer and the outermost insulating layer may occur. Accordingly, in the embodiment, by disposing the pad on the cavity boundary region, the undercut problem, which is weak in reliability, can be solved, and thus product reliability can be improved.

What is claimed is:

1. A printed circuit board comprising:
   a first insulating layer;
   a second insulating layer disposed on the first insulating layer;
   a cavity formed in the first insulating layer and the second insulating layer;
   a first via electrode disposed in the first insulating layer;
   a second via electrode including a portion disposed in the second insulating layer;
   an intermediate circuit layer disposed between the first via electrode and the portion of the second via electrode; and
   a semiconductor device disposed in the cavity,
   wherein the first via electrode overlaps the portion of the second via electrode and the intermediate circuit layer in a vertical direction,
   wherein the cavity includes a first side wall having a first slope angle and a second side wall having a second slope angle smaller than the first slope angle, and
   wherein the semiconductor device overlaps the portion of the second via electrode, the first side wall of the cavity, and the second side wall of the cavity in a horizontal direction perpendicular to the vertical direction.

2. The printed circuit board of claim 1, comprising:
   a third insulating layer disposed on a lower surface of the first insulating layer,
   wherein the first slope angle is 90 degrees or less with respect to an upper surface of the third insulating layer, and
   wherein the second slope angle is less than 90 degrees with respect to the upper surface of the third insulating layer.

3. The printed circuit board of claim 2, wherein the first side wall and the second side wall directly contact each other.

4. The printed circuit board of claim 3, wherein the first side wall and the second side wall directly contact each other at a contact portion, and
   wherein the contact portion is lower than the portion of the second via electrode with respect to the upper surface of the third insulating layer.

5. The printed circuit board of claim 3, wherein the cavity includes a first portion located in the first insulating layer and a second portion located in the second insulating layer,
   wherein a width of the first portion of the cavity is largest at a top of the first portion located in a same plane as an upper surface of the first insulating layer,
   wherein a width of the second portion of the cavity is largest at a top of the second portion located in a same plane as an upper surface of the second insulating layer, and
   wherein the width of the second portion of the cavity at the top of the second portion is greater than the width of the first portion of the cavity at the top of the first portion.

6. The printed circuit board of claim 2, wherein the first side wall of the cavity has a first height, and the second side wall of the cavity has a second height, and
   wherein the first height of the first side wall of the cavity is different from the second height of the second side wall of the cavity.

7. The printed circuit board of claim 6, wherein the second height is greater than the first height.

8. The printed circuit board of claim 5, wherein the semiconductor device includes an upper surface and a lower surface, and
   wherein the upper surface of the semiconductor device is higher than the upper surface of the second insulating layer with respect to the upper surface of the third insulating layer.

9. The printed circuit board of claim 1, wherein the first insulating layer includes a recess portion to form the first side wall, and
wherein the second insulating layer includes a through hole to form the second side wall.

10. The printed circuit board of claim 1, wherein the cavity overlaps the intermediate circuit layer in the horizontal direction.

11. A semiconductor package substrate comprising:
a first insulating layer including an upper surface and a lower surface;
a second insulating layer disposed on the upper surface of the first insulating layer;
a third insulating layer disposed on the lower surface of the first insulating layer;
a cavity formed in the first insulating laser and the second insulating layer;
a first via electrode disposed in the first insulating layer;
a second via electrode including a portion disposed in the second insulating layer;
an intermediate circuit layer disposed between the first via electrode and the portion of the second via electrode; and
a semiconductor device disposed in the cavity,
wherein the first via electrode overlaps the portion of the second via electrode and the intermediate circuit layer in a vertical direction,
wherein the cavity includes a first side wall having a first slope angle and a second side wall having a second slope angle smaller than the first slope angle with respect to an upper surface of the third insulating layer, and
wherein the semiconductor device overlaps the portion of the second via electrode, the first side wall of the cavity, and the second side wall of the cavity in a horizontal direction perpendicular to the vertical direction.

12. The semiconductor package substrate of claim 11, wherein the first side wall and the second side wall directly contact each other.

13. The semiconductor package substrate of claim 12, wherein the first side wall and the second side wall directly contact each other at a contact portion, and
wherein the contact portion is lower than the portion of the second via electrode with respect to the upper surface of the third insulating layer.

14. The semiconductor package substrate of claim 11, wherein the first slope angle is 90 degrees or less with respect to the upper surface of the third insulating layer, and
wherein the second slope angle is less than 90 degrees with respect to the upper surface of the third insulating layer.

15. The semiconductor package substrate of claim 14, wherein the cavity overlaps the intermediate circuit layer in the horizontal direction.

16. The semiconductor package substrate of claim 15, wherein the semiconductor device includes an upper surface and a lower surface, and
wherein the upper surface of the semiconductor device is higher than an upper surface of the second insulating layer with respect to the upper surface of the third insulating layer.

* * * * *